United States Patent
Gottschalk et al.

(10) Patent No.: US 9,571,986 B2
(45) Date of Patent: Feb. 14, 2017

(54) SYSTEMS AND METHODS FOR DETECTING AND USING EQUIPMENT LOCATION IN A BUILDING MANAGEMENT SYSTEM

(71) Applicant: Johnson Controls Technology Company, Holland, MI (US)

(72) Inventors: Donald A. Gottschalk, Wauwatosa, WI (US); Troy A. Goldschmidt, Brown Deer, WI (US); Christopher Brophy, Cedarburg, WI (US)

(73) Assignee: Johnson Controls Technology Company, Plymouth, MI (US)

( * ) Notice: Subject to any disclaimer, the term of this patent is extended or adjusted under 35 U.S.C. 154(b) by 346 days.

(21) Appl. No.: 14/272,150

(22) Filed: May 7, 2014

(65) Prior Publication Data
US 2015/0327010 A1 Nov. 12, 2015

(51) Int. Cl.
G01M 1/38 (2006.01)
H04W 4/04 (2009.01)
(Continued)

(52) U.S. Cl.
CPC .............. H04W 4/043 (2013.01); G05B 15/02 (2013.01); G06F 17/50 (2013.01); H04W 4/02 (2013.01);
(Continued)

(58) Field of Classification Search
CPC ........ H04W 64/00; H04W 4/043; H04W 4/02; H04W 64/003; H04W 4/021; G05B 15/02; G06F 17/50
(Continued)

(56) References Cited

U.S. PATENT DOCUMENTS

| 6,745,027 B2 | 6/2004 | Twitchell, Jr. |
| 6,879,913 B1 | 4/2005 | Yu |

(Continued)

FOREIGN PATENT DOCUMENTS

| CA | 2777693 | 1/2013 |
| CN | 102214000 | 10/2011 |

(Continued)

OTHER PUBLICATIONS

Skeledzija et al., "Smart Home Automation System for Energy Efficient Housing", IEEE, May 2014. pp. 166-177.*
(Continued)

*Primary Examiner* — Robert Fennema
*Assistant Examiner* — Thomas Stevens
(74) *Attorney, Agent, or Firm* — Foley & Lardner LLP

(57) ABSTRACT

Systems and methods for detecting and using equipment location in a building management system are provided. Location information is measured by one or more measurement devices at a physical location of building equipment. The measured location information is used to automatically determine the physical location of the building equipment in or around a building. The location of the building equipment is integrated with an architectural model of a building served by the building equipment and a graphical visualization of the integrated model is generated. The location of the building equipment can be used to automatically associate the building equipment with other building equipment or with a building zone, to automatically generate control parameters and control algorithms, and/or to generate an augmented reality display of the building equipment in the building.

20 Claims, 9 Drawing Sheets

(51) Int. Cl.
  *H04W 4/02*    (2009.01)
  *H04W 64/00*   (2009.01)
  *G05B 15/02*   (2006.01)
  *G06F 17/50*   (2006.01)
  *H04W 4/00*    (2009.01)

(52) U.S. Cl.
  CPC ............. *H04W 4/021* (2013.01); *H04W 64/00* (2013.01); *H04W 64/003* (2013.01); *G05B 2219/25062* (2013.01); *G05B 2219/25065* (2013.01); *G05B 2219/32014* (2013.01); *H04W 4/008* (2013.01)

(58) Field of Classification Search
  USPC ...................................................... 700/275
  See application file for complete search history.

(56) References Cited

U.S. PATENT DOCUMENTS

| | | | |
|---|---|---|---|
| 6,934,540 B2 | 8/2005 | Twitchell, Jr. |
| 7,133,704 B2 | 11/2006 | Twitchell, Jr. |
| 7,155,264 B2 | 12/2006 | Twitchell, Jr. |
| 7,200,132 B2 | 4/2007 | Twitchell, Jr. |
| 7,209,468 B2 | 4/2007 | Twitchell, Jr. |
| 7,209,771 B2 | 4/2007 | Twitchell, Jr. |
| 7,221,668 B2 | 5/2007 | Twitchell, Jr. |
| 7,378,957 B2 | 5/2008 | Twitchell, Jr. |
| 7,378,958 B2 | 5/2008 | Twitchell, Jr. |
| 7,378,959 B2 | 5/2008 | Twitchell, Jr. |
| 7,391,321 B2 | 6/2008 | Twitchell, Jr. |
| 7,394,361 B1 | 7/2008 | Twitchell, Jr. |
| 7,430,437 B2 | 9/2008 | Twitchell, Jr. |
| 7,438,334 B2 | 10/2008 | Terry et al. |
| 7,522,568 B2 | 4/2009 | Twitchell, Jr. |
| 7,526,381 B2 | 4/2009 | Twitchell, Jr. |
| 7,529,547 B2 | 5/2009 | Twitchell, Jr. |
| 7,535,339 B2 | 5/2009 | Twitchell, Jr. |
| 7,538,656 B2 | 5/2009 | Twitchell, Jr. |
| 7,538,657 B2 | 5/2009 | Twitchell, Jr. |
| 7,538,658 B2 | 5/2009 | Twitchell, Jr. |
| 7,539,520 B2 | 5/2009 | Twitchell, Jr. |
| 7,542,849 B2 | 6/2009 | Twitchell, Jr. |
| 7,554,442 B2 | 6/2009 | Twitchell, Jr. |
| 7,563,991 B2 | 7/2009 | Twitchell et al. |
| 7,570,208 B2 | 8/2009 | Wang et al. |
| 7,574,168 B2 | 8/2009 | Twitchell et al. |
| 7,574,300 B2 | 8/2009 | Twitchell et al. |
| 7,583,769 B2 | 9/2009 | Twitchell et al. |
| 7,650,135 B2 | 1/2010 | Twitchell |
| 7,705,747 B2 | 4/2010 | Twitchell, Jr. |
| 7,733,818 B2 | 6/2010 | Twitchell, Jr. |
| 7,733,944 B2 | 6/2010 | Twitchell et al. |
| 7,742,744 B2 | 6/2010 | Twitchell, Jr. |
| 7,742,745 B2 | 6/2010 | Twitchell, Jr. |
| 7,742,772 B2 | 6/2010 | Twitchell, Jr. |
| 7,742,773 B2 | 6/2010 | Twitchell, Jr. |
| 7,746,838 B2 | 6/2010 | Twitchell, Jr. |
| 7,783,246 B2 | 8/2010 | Twitchell et al. |
| 7,822,551 B2 | 10/2010 | Twitchell, Jr. |
| 7,828,342 B2 | 11/2010 | Terry et al. |
| 7,828,343 B2 | 11/2010 | Terry et al. |
| 7,828,344 B2 | 11/2010 | Terry et al. |
| 7,828,345 B2 | 11/2010 | Terry et al. |
| 7,828,346 B2 | 11/2010 | Terry et al. |
| 7,830,273 B2 | 11/2010 | Twitchell, Jr. |
| 7,830,850 B2 | 11/2010 | Twitchell, Jr. |
| 7,830,852 B2 | 11/2010 | Twitchell, Jr. |
| 7,847,676 B2 | 12/2010 | Twitchell, Jr. |
| 7,883,126 B2 | 2/2011 | Terry et al. |
| 7,883,127 B2 | 2/2011 | Terry et al. |
| 7,883,128 B2 | 2/2011 | Terry et al. |
| 7,900,980 B2 | 3/2011 | Terry et al. |
| 7,904,071 B2 | 3/2011 | Twitchell, Jr. |
| 7,907,941 B2 | 3/2011 | Twitchell, Jr. |
| 7,912,644 B2 | 3/2011 | Twitchell, Jr. |
| 7,938,459 B2 | 5/2011 | Terry et al. |
| 7,940,716 B2 | 5/2011 | Twitchell, Jr. |
| 7,940,717 B2 | 5/2011 | Twitchell, Jr. |
| 7,940,719 B2 | 5/2011 | Twitchell, Jr. |
| 7,940,736 B2 | 5/2011 | Twitchell, Jr. |
| 7,941,095 B2 | 5/2011 | Twitchell, Jr. |
| 8,045,929 B2 | 10/2011 | Twitchell, Jr. |
| 8,050,625 B2 | 11/2011 | Twitchell, Jr. |
| 8,050,668 B2 | 11/2011 | Twitchell, Jr. |
| 8,068,807 B2 | 11/2011 | Twitchell, Jr. |
| 8,078,139 B2 | 12/2011 | Twitchell, Jr. |
| 8,095,070 B2 | 1/2012 | Twitchell, Jr. |
| 8,111,651 B2 | 2/2012 | Twitchell, Jr. |
| 8,144,671 B2 | 3/2012 | Twitchell, Jr. |
| 8,172,154 B1* | 5/2012 | Figley ................. F24F 11/0015 165/223 |
| 8,204,439 B2 | 6/2012 | Twitchell, Jr. |
| 8,207,848 B2 | 6/2012 | Berger et al. |
| 8,218,514 B2 | 7/2012 | Twitchell, Jr. |
| 8,223,680 B2 | 7/2012 | Twitchell, Jr. |
| 8,238,826 B2 | 8/2012 | Twitchell, Jr. |
| 8,275,404 B2 | 9/2012 | Berger et al. |
| 8,279,067 B2 | 10/2012 | Berger et al. |
| 8,280,345 B2 | 10/2012 | Twitchell, Jr. |
| 8,284,045 B2 | 10/2012 | Twitchell, Jr. |
| 8,284,741 B2 | 10/2012 | Twitchell, Jr. |
| 8,300,551 B2 | 10/2012 | Koop et al. |
| 8,301,082 B2 | 10/2012 | Twitchell, Jr. |
| 8,315,237 B2 | 11/2012 | Berger et al. |
| 8,315,563 B2 | 11/2012 | Twitchell, Jr. |
| 8,315,565 B2 | 11/2012 | Twitchell, Jr. |
| 8,326,226 B2 | 12/2012 | Twitchell, Jr. |
| 8,331,862 B2 | 12/2012 | Twitchell, Jr. |
| 8,391,435 B2 | 3/2013 | Farley et al. |
| 8,427,508 B2 | 4/2013 | Mattila et al. |
| 8,433,309 B2 | 4/2013 | Twitchell, Jr. |
| 8,462,662 B2 | 6/2013 | Robins |
| 8,605,660 B2 | 12/2013 | Twitchell, Jr. |
| 8,705,523 B2 | 4/2014 | Koop et al. |
| 8,726,478 B2 | 5/2014 | Twitchell et al. |
| 8,755,787 B2 | 6/2014 | Twitchell, Jr. |
| 2004/0256473 A1* | 12/2004 | Hull ....................... F24F 11/006 236/49.3 |
| 2005/0215280 A1 | 9/2005 | Twitchell Jr |
| 2008/0111692 A1 | 5/2008 | Twitchell |
| 2008/0129458 A1 | 6/2008 | Twitchell |
| 2008/0143484 A1 | 6/2008 | Twitchell |
| 2008/0144554 A1 | 6/2008 | Twitchell |
| 2008/0212544 A1 | 9/2008 | Twitchell |
| 2008/0294291 A1* | 11/2008 | Salsbury ................ F24F 11/006 700/277 |
| 2008/0303897 A1 | 12/2008 | Twitchell, Jr. |
| 2008/0304443 A1 | 12/2008 | Twitchell, Jr. |
| 2009/0016308 A1 | 1/2009 | Twitchell, Jr. |
| 2009/0026773 A1 | 1/2009 | Terry et al. |
| 2009/0129306 A1 | 5/2009 | Twitchell et al. |
| 2009/0267770 A1 | 10/2009 | Twitchell, Jr. |
| 2009/0283320 A1 | 11/2009 | Twitchell et al. |
| 2010/0007470 A1 | 1/2010 | Twitchell, Jr. |
| 2010/0070085 A1* | 3/2010 | Harrod ................. F24F 11/0086 700/276 |
| 2010/0114383 A1* | 5/2010 | Rosca ..................... H04L 67/12 700/276 |
| 2010/0121862 A1 | 5/2010 | Twitchell, Jr. |
| 2010/0130267 A1 | 5/2010 | Twitchell, Jr. |
| 2010/0141401 A1 | 6/2010 | Twitchell, Jr. |
| 2010/0145865 A1 | 6/2010 | Berger et al. |
| 2010/0214059 A1 | 8/2010 | Twitchell, Jr. |
| 2010/0214060 A1 | 8/2010 | Twitchell, Jr. |
| 2010/0214061 A1 | 8/2010 | Twitchell et al. |
| 2010/0214074 A1 | 8/2010 | Twitchell, Jr. |
| 2010/0214077 A1 | 8/2010 | Terry et al. |
| 2010/0219938 A1 | 9/2010 | Twitchell, Jr. |
| 2010/0219939 A1 | 9/2010 | Twitchell, Jr. |
| 2010/0231381 A1 | 9/2010 | Twitchell, Jr. |
| 2010/0250460 A1 | 9/2010 | Twitchell, Jr. |
| 2010/0260087 A1 | 10/2010 | Twitchell, Jr. |
| 2010/0330930 A1 | 12/2010 | Twitchell |

(56) References Cited

U.S. PATENT DOCUMENTS

| | | | |
|---|---|---|---|
| 2011/0006882 | A1 | 1/2011 | Twitchell, Jr. |
| 2011/0047015 | A1 | 2/2011 | Twitchell, Jr. |
| 2011/0071685 | A1 | 3/2011 | Huneycutt et al. |
| 2011/0115816 | A1* | 5/2011 | Brackney ............... G06Q 10/06 345/629 |
| 2012/0310416 | A1* | 12/2012 | Tepper .................. G05B 15/00 700/276 |
| 2013/0169681 | A1 | 7/2013 | Rasane et al. |
| 2016/0014558 | A1* | 1/2016 | Berlin .................... G06F 17/40 235/385 |

FOREIGN PATENT DOCUMENTS

| | | |
|---|---|---|
| KR | 100538082 | 12/2005 |
| KR | 20110128096 | 11/2011 |
| KR | 20130053535 | 5/2013 |

OTHER PUBLICATIONS

"Samsung to Acquire CSR for its Indoor GPS technology", Indoor LBS online blog, Jul. 16, 2012, retrieved from the internet at: http://indoorlbs.blogspot.com/2012/07/samsung-to-acquire-csr-for-indoor-gps.html on Aug. 7, 2014, 1 page as printed.

Anthony, "Think GPS is cool? IPS will blow your mind", ExtremeTech, Apr. 24, 2012, retrieved from the internet at http://www.extremetech.com/extreme/126843-think-gps-is-cool-ips-will-blow-your-mind/2 on Aug. 7, 2014, 4 pages as printed.

Boogar, "Why Polestar's indoor GPS Technology 10 years in the making is the future of local commerce", Rude Baguette—online blog, Apr. 15, 2013, retrieved from the internet at http://www.rudebaguette.com/2013/04/15/why-polestars-indoor-gps-technology-10-years-in-the-making-is-the-future-of-local-commerce/ on Aug. 7, 2014, 3 pages as printed.

Broadcom Integrated Multi-Constellation GNSS Receiver BCM4752 Product Information Page, retrieved from the internet at http://www.broadcom.com/products/GPS/GPS-Silicon-Solutions/BCM4752 on Aug. 7, 2014, 1 page.

Murfin, "Indoor Location Breaking Through", GPS World—online, Apr. 17, 2013, retrieved from the internet at: http://gpsworld.com/indoor-location-breaking-through/ on Aug. 7, 2014, 3 pages as printed.

U.S. Department of Energy National Renewable Energy Laboratory, "Augmented Reality Building Operations Tool", retrieved from the internet at http://techportal.eere.energy.gov/technology.do/techID=540# on Aug. 7, 2014, 2 pages.

Ward-Bailey, "Indoor GPS: Why tech companies want to track you inside", The Christian Science Monitor—online, Mar. 28, 2013, retrieved from the internet at http://www.csmonitor.com/Innovation/Horizons/2013/0328/Indoor-GPS-Why-tech-companies-want-to-track-you-inside on Aug. 7, 2014, 2 pages.

* cited by examiner

SYSTEMS AND METHODS FOR DETECTING AND USING EQUIPMENT LOCATION IN A BUILDING MANAGEMENT SYSTEM

BACKGROUND

The present disclosure relates generally to the field of building management systems. The present disclosure relates more particularly to systems and methods for detecting and using the location of a building equipment in a building management system.

A building management system (BMS) is, in general, a system of devices configured to control, monitor, and manage equipment in or around a building or building area. A BMS can include a heating, ventilation, and air conditioning (HVAC) system, a security system, a lighting system, a fire alerting system, another system that is capable of managing building functions or devices, or any combination thereof. BMS devices may be installed in any environment (e.g., an indoor area or an outdoor area) and the environment may include any number of buildings, spaces, zones, rooms, or areas. A BMS may include METASYS building controllers or other devices sold by Johnson Controls, Inc., as well as building devices and components from other sources.

A BMS may include one or more computer systems (e.g., servers, BMS controllers, etc.) that serve as enterprise level controllers, application or data servers, head nodes, master controllers, or field controllers for the BMS. Such computer systems may communicate with multiple downstream building systems or subsystems (e.g., an HVAC system, a security system, etc.) according to like or disparate protocols (e.g., LON, BACnet, etc.). The computer systems may also provide one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with the BMS, its subsystems, and devices.

SUMMARY

One implementation of the present disclosure is a method for detecting and using equipment location in a building management system. The method includes receiving measured location information at a processing circuit. The measured location information is obtained by one or more measurement devices at a physical location of building equipment in a building management system. The method further includes automatically determining, by the processing circuit, the physical location of the building equipment in the building management system using the measured location information, integrating, by the processing circuit, the physical location of the building equipment with an architectural model of a building served by the building equipment, and generating, by the processing circuit, a graphical visualization of the building equipment integrated with the architectural model of the building. The building equipment is displayed in the graphical visualization at the location determined by the processing circuit.

In some embodiments, the method further includes receiving a device identifier in conjunction with the location information. The device identifier may indicate a particular building equipment device. In some embodiments, the method further includes storing an association between the device identifier and the physical location of the building equipment.

In some embodiments, the graphical visualization of the building equipment includes at least one of equipment-specific attributes for the building equipment and a current status of the building equipment.

In some embodiments, the physical location of the building equipment is three-dimensional physical location, the architectural model of the building is a three-dimensional architectural model, and the graphical visualization of the building equipment is a three-dimensional graphical visualization.

In some embodiments, the one or more measurement devices include at least one of a GPS device and an altimeter. In some embodiments, the location information comprise at least one of GPS coordinates and an altitude measurement. In some embodiments, the one or more measurement devices are components of the building equipment. In other embodiments, the one or more measurement devices are components of a mobile device separate from the building equipment.

In some embodiments, the location information includes GPS coordinates measured by the mobile device at an entrance of the building and distance differential data indicating a distance between the entrance of the building and the building equipment. Automatically determining the physical location of the building equipment may include calculating the physical location of the building equipment using the GPS coordinates and the distance differential data.

In some embodiments, the method further includes using the physical location of the building equipment to generate an association between the building equipment and other building equipment of the building management system.

In some embodiments, the method further includes using the physical location of the building equipment to generate an association between the building equipment and a building zone.

In some embodiments, the method further includes using the physical location of the building equipment to automatically address the building equipment.

In some embodiments, the method further includes using the physical location of the building equipment to generate at least one of a control parameter and a control algorithm for the building management system.

In some embodiments, the method further includes generating an augmented reality display of the building equipment. The augmented reality display may include a view of the graphical visualization of the building equipment from a perspective of a mobile device superimposed over a camera-derived view of the building from the perspective of the mobile device.

Another implementation of the present disclosure is a method for assigning relationships between building management system (BMS) devices. The method includes automatically determining, by a processing circuit, a physical location of a first BMS device and a plurality of other BMS devices using measured location information, identifying a type of the first BMS device and the plurality of other BMS devices, identifying one or more of the other BMS devices as potentially related to the first BMS device based on the type of the first BMS device, and ranking each identified BMS device based on a physical distance between the first BMS device and the identified BMS device. The physical distance is a function of the physical location of the first BMS device and the physical location of the identified BMS device. The method further includes generating an association between the first BMS device and one of the other BMS devices based on a result of the ranking.

In some embodiments, the method further includes the association between the first BMS device and one of the other BMS devices is a recommended association. The method may further include presenting the recommended association via a user interface device and prompting a user to confirm or reject the recommended association.

Another implementation of the present disclosure is system for detecting and using equipment location in a building management system. The system includes a processing circuit configured to receive measured location information. The measured location information is obtained by one or more measurement devices at a physical location of building equipment in a building management system. The processing circuit is configured to automatically determine the physical location of the building equipment in the building management system using the measured location information, to integrate the physical location of the building equipment with an architectural model of a building serviced by the building management system, and to generate a graphical visualization of the building equipment integrated with the architectural model of the building. The building equipment is displayed in the graphical visualization at the location determined by the processing circuit.

In some embodiments, the processing circuit is configured to receive a device identifier in conjunction with the location information. The device identifier may indicate a particular building equipment device. In some embodiments, the processing circuit is configured to store an association between the device identifier and the physical location of the building equipment.

In some embodiments, the graphical visualization of the building equipment includes at least one of equipment-specific attributes for the building equipment and a current status of the building equipment.

In some embodiments, the one or more measurement devices include at least one of a GPS device and an altimeter. The one or more measurement devices may be components of the building equipment or a mobile device separate from the building equipment.

In some embodiments, the processing circuit is configured to generate an augmented reality display of the building equipment. The augmented reality display may include a view of the graphical visualization of the building equipment from a perspective of a mobile device superimposed over a camera-derived view of the building from the perspective of the mobile device.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

DETAILED DESCRIPTION

Figure 1:
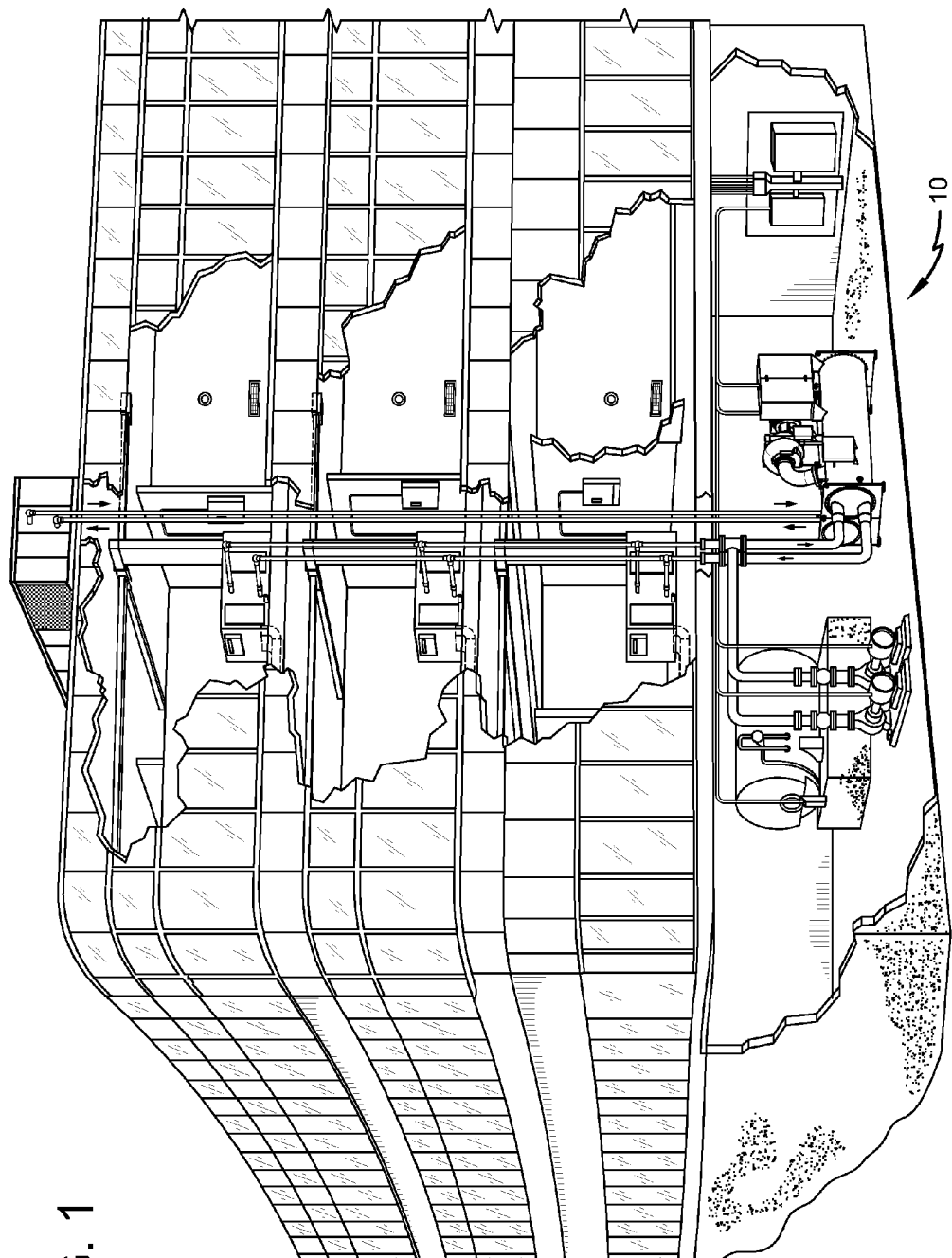
FIG. 1 is a drawing of a building equipped with a building management system (BMS), according to an exemplary embodiment.

Referring generally to the FIGURES, systems and methods for detecting and using equipment location in a building management system (BMS) are shown, according to various exemplary embodiments. The systems and methods described herein may be used to automatically determine the location of building equipment (e.g., sensors, actuators, control devices, HVAC equipment, etc.) in or around a building. In some embodiments, an indoor positioning system is used to determine a three-dimensional location for building equipment based on the strength of wireless signals (e.g., WiFi signals, Bluetooth signals, RFID signals, Zigbee signals, near field communication (NFC) signals, etc.) sent or received by the building equipment. In other embodiments, building equipment may be outfitted with a GPS device and/or an altimeter. The building equipment may report GPS coordinates and/or altimeter measurements to the BMS. Alternatively, a technician can walk around the building with a mobile device that measures GPS coordinates and/or altitude, mapping the location of the building equipment via the mobile device. If the GPS signal is too weak inside the building, the mobile device can record the GPS location at the entrance of the building and use accelerometer data to determine the distance from the building entrance to the building equipment.

The systems and methods of the present disclosure may be used to generate or obtain a three-dimensional model of the building architecture. The three-dimensional model of the building architecture can be generated or obtained in a variety of different ways. For example, the three-dimensional building model may be generated using existing blueprints or floor plans, imported from a CAD file, or created as a new CAD model. In some embodiments, optical imaging or other automatic measuring may be used to map the interior of the building for use in automatically generating the three-dimensional building model.

The three-dimensional location data for the building equipment may be applied to the three-dimensional model for the building to map the building equipment to specific locations within or around the building. In various embodiments, three-dimensional location data may include three-dimensional coordinates (e.g., x, y, and z coordinates) or two-dimensional coordinates with floor information (e.g., x and y coordinates and a floor number). Device information for each piece of building equipment (e.g., type of device, status of device, name of device, control relationship to other devices, etc.) may be associated with the corresponding building equipment and displayed visually in the three-dimensional model of the building. For example, building equipment can be represented in the model of the building according to equipment-specific attributes and/or status (e.g., flashing red if a fault is detected). The visualization of the building equipment in the three-dimensional model may be used to show the exact location of equipment that needs maintenance.

In some embodiments, the three-dimensional location of building equipment in the building may be used to automatically or semi-automatically associate pieces of building equipment with a particular building zone and/or with each other. For example, a user interface may be provided (e.g., to a technician or installer) that recommends device associations and/or zone associations based on the location of the equipment. The user interface may be used to confirm or reject the recommended device associations and/or the zone associations during a commissioning or provisioning process. The three-dimensional location of building equipment may be used to automatically address the building equipment (e.g., assigning unique parameters such as a MAC address, a device name, etc.) during commissioning or for a retrofit installation and to automate device pairing for wireless devices.

In some embodiments, the three-dimensional location of building equipment in the building may be used to automatically set or recommend control parameters for the building equipment. For example, a user interface may be provided that suggests location-based control parameters for a user to accept or reject (e.g., flow rate parameters based on the size of the room in which a VAV box is located). The location of the building equipment may also be used to generate control algorithms for a controller or a building zone (e.g., predicting a change in demand resulting from sunlight entering through windows based on the orientation of the building and the locations of the building zones, moving warmer air from higher elevation zones to lower elevation zones by establishing pressure gradients, etc.).

In some embodiments, the three-dimensional location of building equipment in the building may be used to generate an augmented reality display of building equipment locations. An augmented reality view of the indoor and outdoor building equipment can show equipment projected upon or superimposed over a live camera-derived image (e.g., on the display of a user device). The augmented reality display may allow service personnel to quickly identify equipment present in a building, even through walls, floors, or ceilings. For example, a technician can point a mobile device with a camera (e.g., a smart phone, a tablet, etc.) toward a wall that has building equipment located on the side of the wall. Based on the three-dimensional location data of the building equipment and using the devices internal peripherals (e.g. compass, accelerometer, etc.), the virtual position of the building equipment can be overlaid on the live camera view on the device's display. The status of the equipment (e.g., fault status, equipment name, type, unique identification, etc.) may be displayed in real time via the augmented reality display.

Referring now to FIG. 1, a perspective view of a building 10 is shown, according to an exemplary embodiment. A BMS serves building 10. The BMS for building 10 may include any number or type of devices that serve building 10. For example, each floor may include one or more security devices, video surveillance cameras, fire detectors, smoke detectors, lighting systems, HVAC systems, or other building systems or devices. In modern BMSs, BMS devices can exist on different networks within the building (e.g., one or more wireless networks, one or more wired networks, etc.) and yet serve the same building space or control loop. For example, BMS devices may be connected to different communications networks or field controllers even if the devices serve the same area (e.g., floor, conference room, building zone, tenant area, etc.) or purpose (e.g., security, ventilation, cooling, heating, etc.).

BMS devices may collectively or individually be referred to as building equipment. Building equipment may include any number or type of BMS devices within or around building 10. For example, building equipment may include controllers, chillers, rooftop units, fire and security systems, elevator systems, thermostats, lighting, serviceable equipment (e.g., vending machines), and/or any other type of equipment that can be used to control, automate, or otherwise contribute to an environment, state, or condition of building 10. The terms "BMS devices," "BMS device" and "building equipment" are used interchangeably throughout this disclosure.

Figure 2:
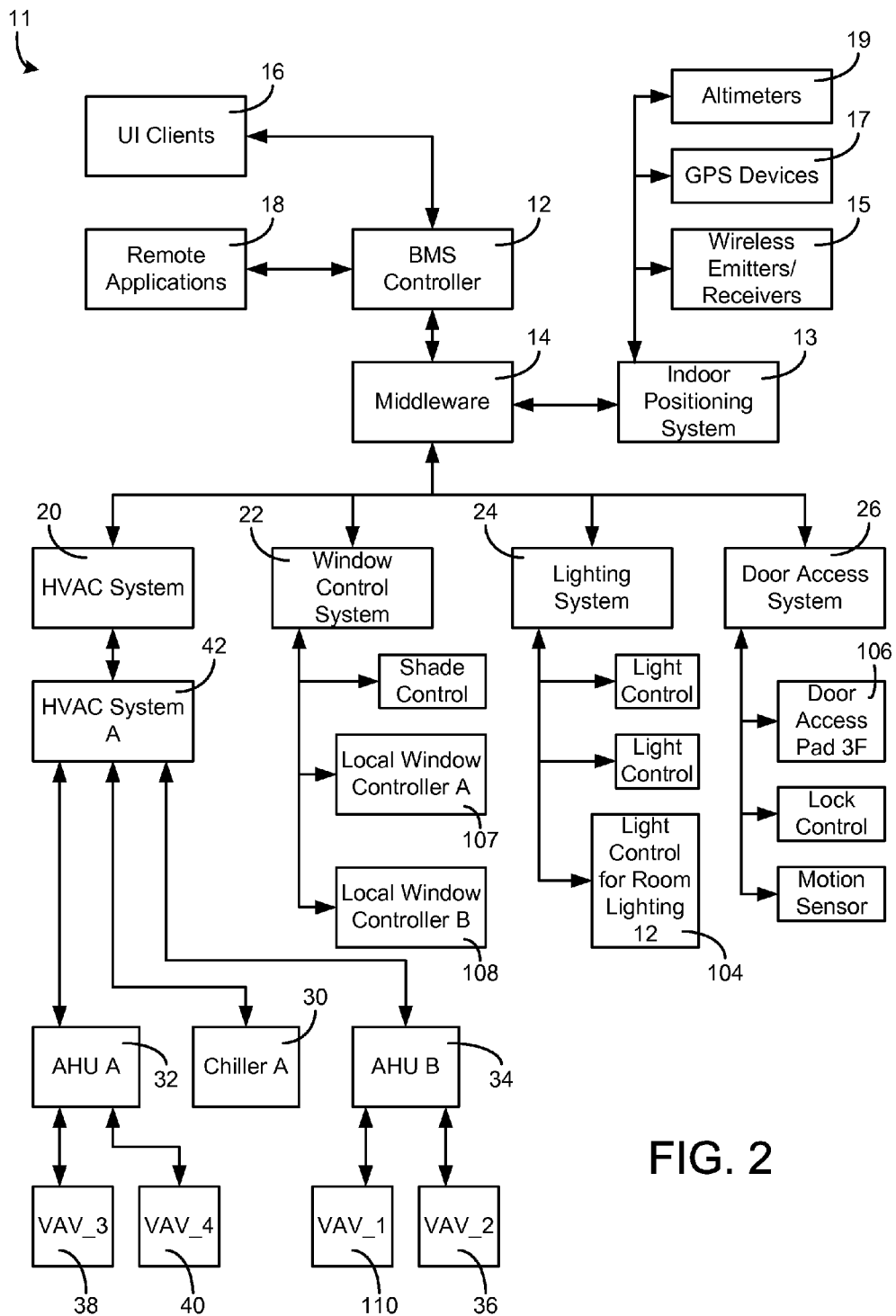
FIG. 2 is a block diagram illustrating the BMS of FIG. 1, according to an exemplary embodiment.

Referring now to FIG. 2, a block diagram of an exemplary BMS 11 for building 10 is shown, according to an exemplary embodiment. BMS 11 is shown to include a plurality of BMS subsystems 20-26. Each BMS subsystem 20-26 is connected to a plurality of BMS devices and makes data points for varying connected devices available to upstream BMS controller 12. Additionally, BMS subsystems 20-26 may encompass other lower-level subsystems. For example, an HVAC system may be broken down further as "HVAC system A," "HVAC system B," etc. In some buildings, multiple HVAC systems or subsystems may exist in parallel and may not be a part of the same HVAC system 20.

As shown in FIG. 2, BMS 11 may include a HVAC system 20. HVAC system 20 may control HVAC operations building 10. HVAC system 20 is shown to include a lower-level HVAC system 42 (named "HVAC system A"). HVAC system 42 may control HVAC operations for a specific floor or zone of building 10. HVAC system 42 may be connected to air handling units (AHUs) 32, 34 (named "AHU A" and "AHU B," respectively, in BMS 11). AHU 32 may control variable air volume (VAV) boxes 38, 40 (named "VAV_3" and "VAV_4" in BMS 11). Likewise, AHU 34 may control VAV boxes 36 and 110 (named "VAV_2" and "VAV_1"). HVAC system 42 may also include chiller 30 (named "Chiller A" in BMS 11). Chiller 30 may provide chilled fluid to AHU 32 and/or to AHU 34. HVAC system 42 may receive data (i.e., BMS inputs such as temperature sensor readings, damper positions, temperature setpoints, etc.) from AHUs 32, 34. HVAC system 42 may provide such BMS inputs to HVAC system 20 and on to middleware 14 and BMS controller 12. Similarly, other BMS subsystems may receive inputs from other building devices or objects and provide the received inputs to BMS controller 12 (e.g., via middleware 14).

Middleware 14 may include services that allow interoperable communication to, from, or between disparate BMS subsystems 20-26 of BMS 11 (e.g., HVAC systems from different manufacturers, HVAC systems that communicate according to different protocols, security/fire systems, IT resources, door access systems, etc.). Middleware 14 may be, for example, an EnNet server sold by Johnson Controls, Inc. While middleware 14 is shown as separate from BMS controller 12, middleware 14 and BMS controller 12 may integrated in some embodiments. For example, middleware 14 may be a part of BMS controller 12.

Still referring to FIG. 2, window control system 22 may receive shade control information from one or more shade controls, ambient light level information from one or more light sensors, and/or other BMS inputs (e.g., sensor information, setpoint information, current state information, etc.) from downstream devices. Window control system 22 may include window controllers 107, 108 (e.g., named "local window controller A" and "local window controller B," respectively, in BMS 11). Window controllers 107, 108 control the operation of subsets of window control system 22. For example, window controller 108 may control window blind or shade operations for a given room, floor, or building in the BMS.

Lighting system 24 may receive lighting related information from a plurality of downstream light controls (e.g., from room lighting 104). Door access system 26 may receive lock control, motion, state, or other door related information from a plurality of downstream door controls. Door access system 26 is shown to include door access pad 106 (named "Door Access Pad 3F"), which may grant or deny access to a building space (e.g., a floor, a conference room, an office, etc.) based on whether valid user credentials are scanned or entered (e.g., via a keypad, via a badge-scanning pad, etc.).

BMS subsystems 20-26 may be connected to BMS controller 12 via middleware 14 and may be configured to provide BMS controller 12 with BMS inputs from various BMS subsystems 20-26 and their varying downstream devices. BMS controller 12 may be configured to make differences in building subsystems transparent at the human-machine interface or client interface level (e.g., for connected or hosted user interface (UI) clients 16, remote applications 18, etc.). BMS controller 12 may be configured to describe or model different building devices and building subsystems using common or unified building objects (e.g., software objects stored in memory) to help provide the transparency. Software building objects may allow developers to write applications capable of monitoring and/or controlling building zones on a zone-by-zone level regardless of the building subsystem makeup.

Still referring to FIG. 2, BMS 11 is shown to include an indoor positioning system 13. Indoor positioning system 13 may be configured to automatically determine a three-dimensional location of BMS devices within building 10. Indoor positioning system 15 may be connected to BMS controller 12 via middleware 14 and is shown to include wireless emitters/receivers 15, global positioning system (GPS) devices 17, and altimeters 19.

Wireless emitters/receivers 15 may be positioned at various locations within or around building 10 (e.g., inside rooms or zones, at entrance/exit points, in hallways, etc.). Wireless emitters/receivers 15 may be configured to emit, receive, sense, relay, or otherwise engage in unidirectional or bidirectional wireless communications. Wireless emitters/receivers 15 may use any type wireless technology or communications protocol. For example, in various embodiments, wireless emitters/receivers 15 may be Bluetooth low energy (BLE) emitters, near field communications (NFC) devices, WiFi transceivers, RFID devices, ultrawide band (UWB) devices, infrared emitters/sensors, visible light communications (VLC) devices, ultrasound devices, cellular transceivers, or any other type of hardware configured to facilitate wireless data communications. In some embodiments, wireless emitters/receivers 15 may be integrated with BMS devices within building 10 (e.g., thermostats, lighting sensors, zone controllers).

In some embodiments, each of wireless emitters/receivers 15 is associated with a particular building zone (e.g., a room, a hallway, an entry or exit point, etc.). The associations between wireless emitters/receivers 15 and building zones may be managed by indoor positioning system 13. For example, when a wireless emitters/receivers is installed in building 10, the location of the wireless emitters/receivers may be stored in memory (e.g., as an attribute of a software defined building object representing a building zone) and the wireless emitters/receivers may be mapped (e.g., associated with, linked, etc.) to a particular building zone. In various embodiments, a single building zone may be associated with any number of wireless emitters/receivers 15 and each of wireless emitters/receivers 15 may be associated with any number of building zones. Each of wireless emitters/receivers 15 may be located at a different position in or around building 10.

In some embodiments, each of wireless emitters/receivers 15 is associated with a different emitter identifier. Emitter identifiers may include, for example, a universally unique identifier (UUID) such as a MAC address, a SSID, a hash value (e.g., MD5, SHA-1, etc.), a random string, a device name, a serial number, or any other identifier capable of distinguishing between different wireless emitters/receivers 15. In some embodiments, each of wireless emitters/receivers 15 is associated with multiple different emitter identifiers. For example, a wireless emitters/receivers may be associated with a UUID value, a minor value, and a major value. Each of wireless emitters/receivers 15 may be configured to broadcast one or more emitter identifiers as part of a wireless signal.

In some embodiments, wireless emitters/receivers 15 are used to determine the location of building equipment within building 10. For example, the wireless signals emitted by wireless emitters/receivers 15 may be detected by various BMS devices in or around building 10 (e.g., devices of BMS subsystems 20-26). BMS devices may be configured to identify the emitter identifier associated with detected wireless signals and to report detected emitter identifiers to indoor positioning system 13 and/or BMS controller 12. Indoor positioning system 13 and/or BMS controller 12 may use the emitter identifier or identifiers reported by BMS devices to determine the location of the BMS devices in or around building 10 (e.g., in a particular building zone within building 10, between building zones, outside building 10, etc.). For example, BMS controller 12 may use a stored association between the emitter identifier reported by a BMS device and a particular building zone to determine that the mobile device is located within or near the associated building zone.

Still referring to FIG. 2, indoor positioning system 13 is shown to include GPS devices 17 and altimeters 19. GPS devices 17 may include GPS receivers in communication with GPS satellites. Each of GPS devices 17 may be configured calculate its global position by precisely timing the signals sent by the GPS satellites. For example, each satellite may continuously transmit messages that include the time the message was transmitted and satellite position at time of message transmission. GPS devices 17 may use messages received from the GPS satellites to determine the transit time of each message and to compute the distance to each satellite using the speed of light. Each of GPS devices 17 may be configured to determine its own geospatial position. In various embodiments, GPS devices 17 may calculate a two-dimensional position (e.g., two-dimensional GPS coordinates, latitude and longitude, etc.) or a three-dimensional position (e.g., GPS coordinates and an altitude).

Altimeters 19 may be configured to measure an altitude. In some embodiments, altimeters 19 may be used in conjunction with GPS devices 17 to determine a three-dimensional location of a GPS device and altimeter pair. For example, GPS devices 17 may determine a two-dimensional (e.g., horizontal) position and altimeters 19 may determine a one-dimensional (e.g., vertical) altitude. GPS devices 17 and altimeters 19 may send positioning data to indoor positioning system 13. Indoor positioning system 13 may be configured to combine the two-dimensional location from GPS devices 17 with the altitude from altimeters 19 to determine a three-dimensional location.

In some embodiments, GPS devices 17 and/or altimeters 19 are integrated with the building equipment. For example, AHU 32, AHU 34, chiller 30, and/or other BMS devices may each include an integrated GPS device and/or an integrated altimeter. In some embodiments, some or all of the building equipment are configured to determine their own three-dimensional (i.e., global) positions based on the GPS data and altitude data obtained by integrated GPS devices 17 and/or altimeters 19. The building equipment may report their three-dimensional positions to BMS controller 12. In other embodiments, the building equipment may be configured to report GPS coordinates and/or altitude data to indoor positioning system 13 and/or BMS controller 12. Indoor positioning system 13 and/or BMS controller 12 may use the data from GPS devices 17 and altimeters 19 to determine a three-dimensional position of the building equipment. BMS controller 12 and/or indoor positioning system 13 may be configured to associate a three-dimensional location with a particular BMS device and to store the three-dimensional location in a memory device or database (e.g., as an attribute of the associated BMS device).

In some embodiments, GPS devices 17 and/or altimeters 19 are components of one or more mobile devices separate from the building equipment. For example, GPS devices 17 and/or altimeters 19 may be components of smart phone, tablet, laptop computer, or other portable electronic devices. In some implementations, the three-dimensional positions of the building equipment may be determined by physically transporting a mobile device that includes a GPS device and/or altimeter to the location of the building equipment and measuring the three-dimensional position of the mobile device. For example, a technician can walk around building 10 with a mobile device that measures GPS position and altitude and record the three-dimensional location of the mobile when the mobile device is near the building equipment. The technician can enter a device identifier of the building equipment (e.g., manually or by scanning the BMS device) to associate a three-dimensional position with a particular BMS device.

In some implementations, the GPS signal may be too weak inside building 10 to obtain an accurate GPS measurement. However, the three-dimensional location of the building equipment can still be obtained by combining outdoor GPS data with distance data measured by the mobile device. For example, the mobile device may be configured to record a GPS location at an entrance of building 10. The mobile device may include an accelerometer configured to collect data from which a change in position can be determined (e.g., device acceleration data). The GPS location of the building entrance can be combined (e.g., by the mobile device, by BMS controller 12, etc.) with the change in position of the mobile device from the building entrance to the building equipment to determine the three-dimensional location of building equipment within building 10.

In some embodiments, the mobile device is configured to report GPS coordinates, altitude data, and/or position differential data to indoor positioning system 13 and/or BMS controller 12. Indoor positioning system 13 and/or BMS controller 12 may use the data from the mobile device to determine a three-dimensional position of the mobile device at various equipment locations. BMS controller 12 and/or indoor positioning system 13 may be configured to associate a three-dimensional location with a particular BMS device (e.g., based on device identifier information entered by a technician) and to store the three-dimensional location in a memory device or database (e.g., as an attribute of the associated BMS device).

Figure 3:
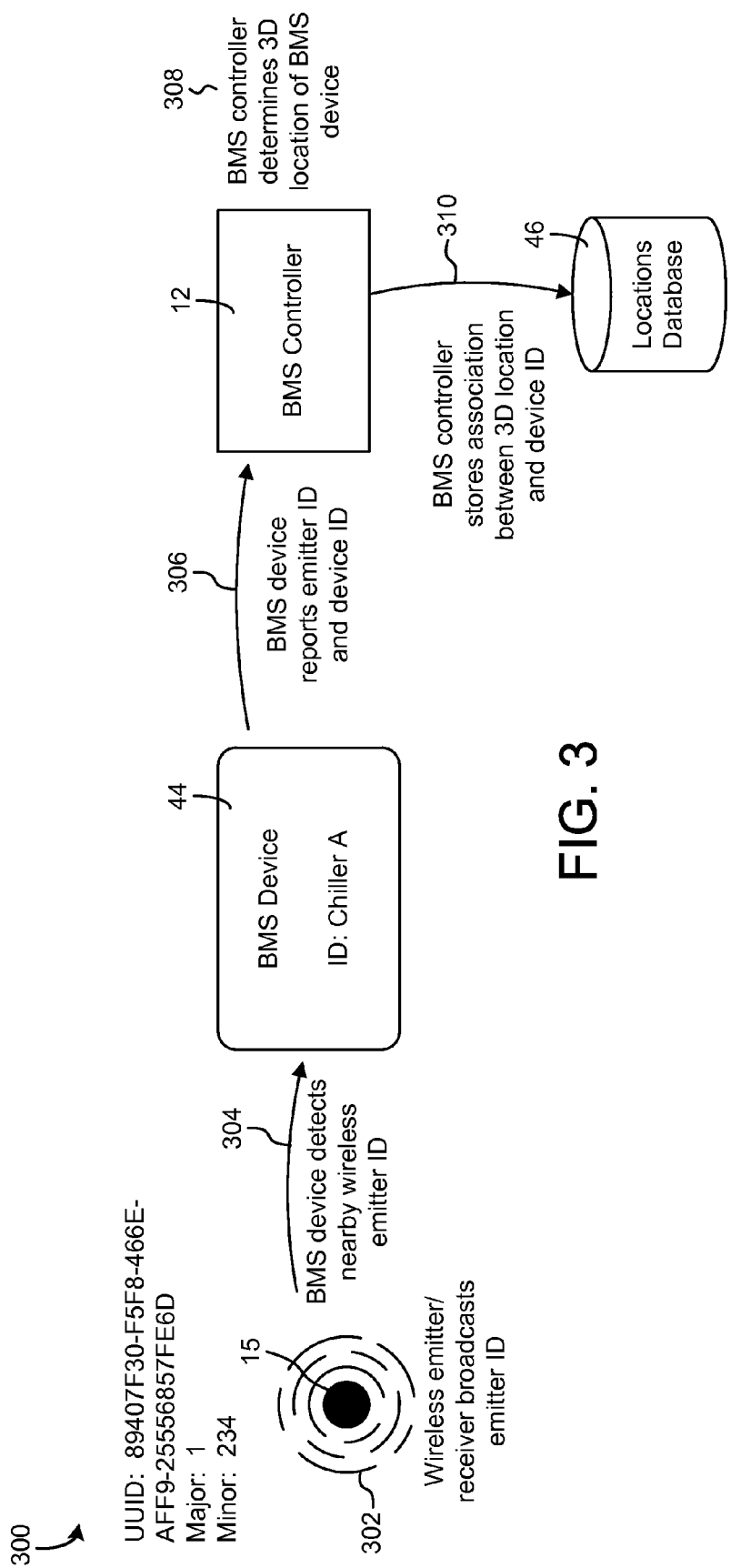
FIG. 3 is a flow diagram illustrating a process for determining the location of building equipment in the building of FIG. 1 using the plurality of wireless emitters, according to an exemplary embodiment.

Referring now to FIG. 3, a flow diagram illustrating a process 300 for determining a three-dimensional location of building equipment using wireless emitters/receivers 15 is shown, according to an exemplary embodiment. A building (e.g., building 10) is equipped with a plurality of wireless emitters/receivers 15. Each of wireless emitters/receivers 15 may be located at a different position in the building and may be associated with a different emitter identifier. Although only one wireless emitter/receiver 15 is shown in FIG. 3, many wireless emitters/receivers 15 may be placed at various locations in or around the building (e.g., inside rooms or zones, at entrance/exit points, in hallways, etc.).

Wireless emitters/receivers 15 may be configured to emit, receive, sense, relay, or otherwise engage in unidirectional or bidirectional wireless communications. Wireless emitters/receivers 15 may use any type wireless technology or communications protocol. For example, in various embodiments, wireless emitters/receivers 15 may be Bluetooth low energy (BLE) emitters, near field communications (NFC) devices, WiFi transceivers, RFID devices, ultrawide band (UWB) devices, infrared emitters/sensors, visible light communications (VLC) devices, ultrasound devices, cellular transceivers, iBeacons, or any other type of hardware configured to facilitate wireless data communications. In some embodiments, wireless emitters/receivers 15 may be integrated with BMS devices within building 10 (e.g., thermostats, lighting sensors, zone controllers).

As shown in FIG. 3, each of wireless emitters/receivers 15 may broadcast a wireless signal (step 302). The wireless signal broadcast by an emitter/receiver 15 includes an indication of an emitter identifier associated with wireless emitter/receiver 15. In some embodiments, the wireless signal broadcast by emitter/receiver 15 include multiple emitter identifiers (e.g., a UUID value, a major value, a minor value, etc.).

Still referring to FIG. 3, a BMS device 44 detects the wireless signal emitted by wireless emitter/receiver 15 (step 304). BMS device 44 may be any device of BMS 11 (e.g., a chiller, an AHU, a VAV, a thermostat, a shade controller, a HVAC controller, etc.) as previously described with reference to FIGS. 1-2. BMS device 44 may be configured to identify the emitter identifier associated with the wireless signal detected in step 304. BMS device 44 is associated with device identifier (e.g., "Chiller A" in FIG. 3) that can be used to distinguish BMS device 44 from other BMS devices.

In some embodiments, BMS device 44 reports the emitter identifier associated with the detected wireless signal and the device identifier to BMS controller 12 (step 306). BMS controller 12 may use the emitter identifier to determine a three-dimensional location of BMS device 44 (e.g., in a particular room or building zone, nearby a particular wireless emitter receiver 15, etc.) (step 308). In other embodiments, BMS device 44 determines its own three-dimensional location based on the detected emitter identifier(s) and reports the three-dimensional location to BMS controller 12. BMS controller 12 may be configured to associate the three-dimensional location with the device identifier and to store the association in a locations database 46 (step 310).

Figure 4:
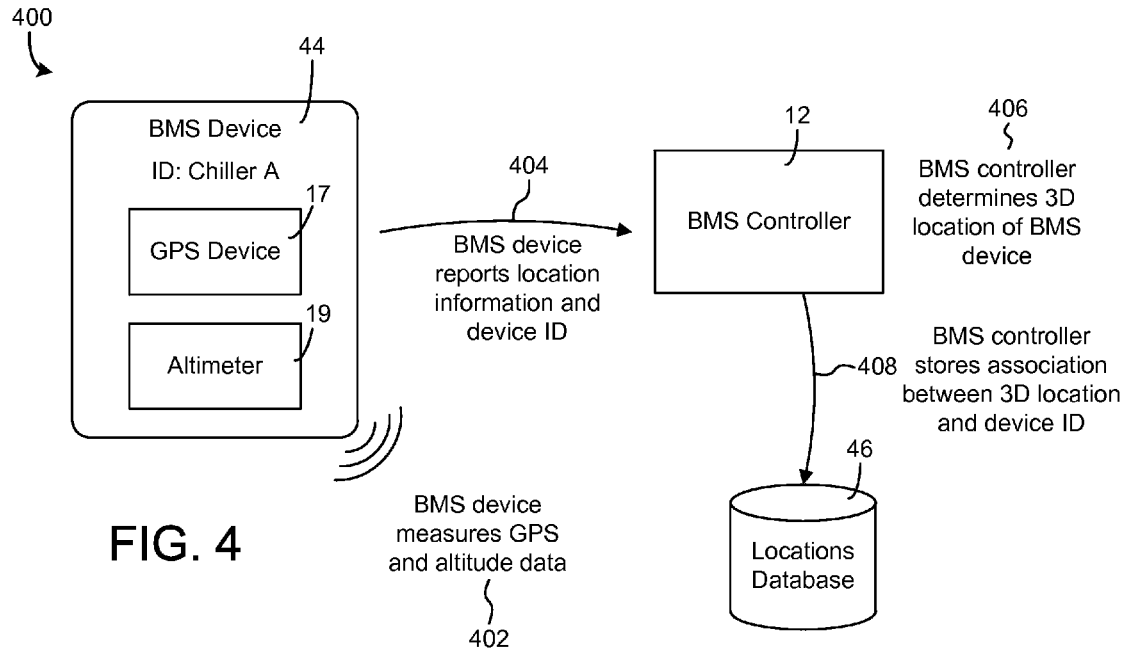
FIG. 4 is a flow diagram illustrating a process for determining the location of building equipment in the building of FIG. 1 using a GPS device and altimeter integrated with the building equipment, according to an exemplary embodiment.

Referring now to FIG. 4, a flow diagram of a process 400 for determining a three-dimensional location of building equipment using integrated GPS devices and altimeters is shown, according to an exemplary embodiment. As shown in FIG. 4, BMS device 44 may include an integrated GPS device 17 and an integrated altimeter 19. BMS device 44 may measure GPS and altitude data using GPS device 17 and altimeter 19 (step 402).

In some embodiments, BMS device 44 reports the location information (e.g., GPS data and altitude data) and the device identifier to BMS controller 12 (step 404). BMS controller 12 may use the location information and the device identifier to determine a three-dimensional location of BMS device 44 (step 406). In other embodiments, BMS device 44 determines its own three-dimensional (i.e., global) position based on the GPS data and altitude data and reports the three-dimensional location to BMS controller 12. BMS controller 12 may be configured to associate the three-dimensional location with the device identifier and to store the association in a locations database 46 (step 408).

Figure 5:
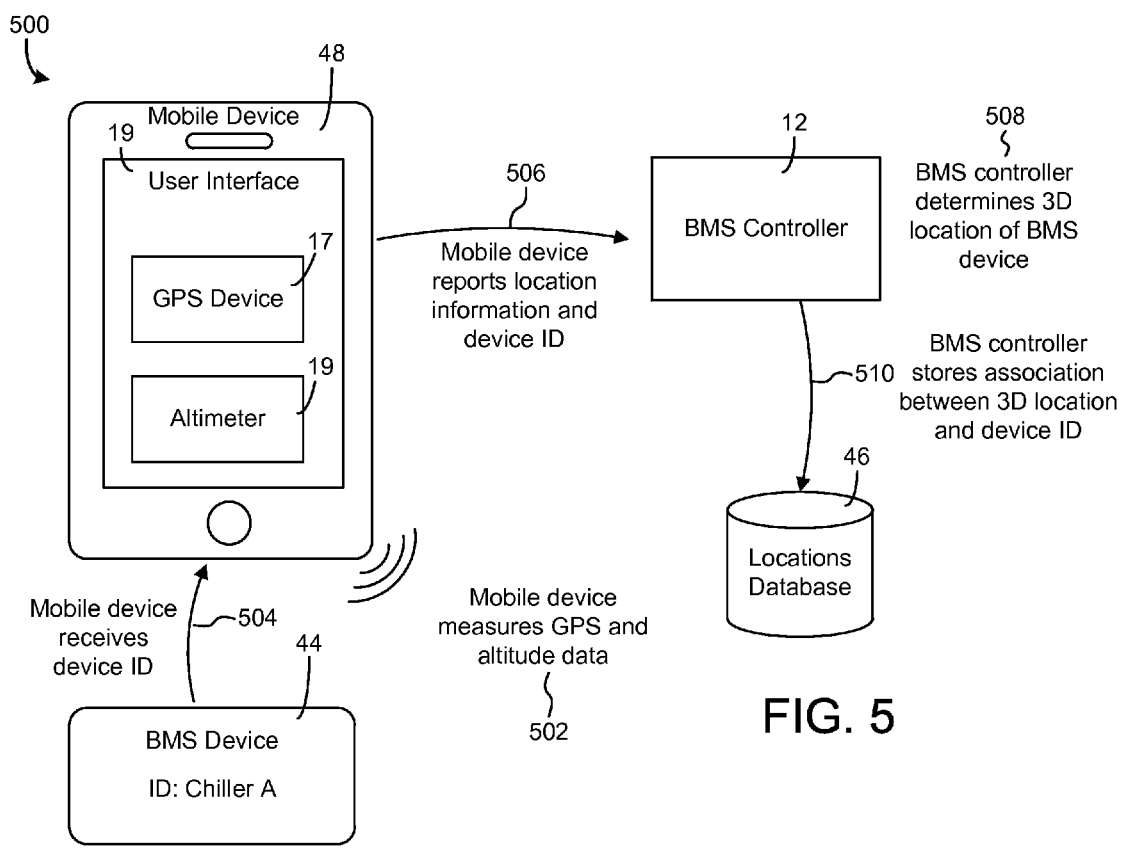
FIG. 5 is a flow diagram illustrating a process for determining the location of building equipment in the building of FIG. 1 using a GPS device and altimeter integrated with a mobile device separate from the building equipment, according to an exemplary embodiment.

Referring now to FIG. 5, a flow diagram of a process 500 for determining a three-dimensional location of building equipment using a mobile device is shown, according to an exemplary embodiment. As shown in FIG. 5, mobile device 48 may include a GPS device 17 and an altimeter 19. Mobile device 48 may be transported to the physical location of BMS device 44 within building 10. Mobile device 48 may measure GPS and altitude data using GPS device 17 and altimeter 19 (step 502). The measured GPS and altitude data indicate the three-dimensional location of both mobile device 48 and BMS device 44 if mobile device 48 and BMS device 44 have the same or similar three-dimensional location at the time the GPS data and altitude data are measured.

In some embodiments, mobile device 48 is configured to record a GPS location at an entrance of a building. Mobile device 48 may include an accelerometer configured to collect data from which a change in position can be determined. Mobile device 48 may combine the GPS location of the building entrance with the change in position of mobile device 48 from the building entrance to the location of BMS device 44 to determine the three-dimensional location of BMS 44 within building 10.

Mobile device 48 receives a device identifier for BMS device 44 (step 504). The device identifier may be received automatically from BMS device 44 (e.g., via a communications link) or received as a user input. For example, a technician can input the device identifier manually via user interface 19 or by scanning BMS device using onboard hardware of mobile device 48 (e.g., a RFID scanner, an optical scanner, etc.).

In some embodiments, mobile device 48 reports the location information (e.g., GPS data and altitude data) and the device identifier to BMS controller 12 (step 506). BMS controller 12 may use the location information and the device identifier to determine a three-dimensional location of BMS device 44 (step 508). In other embodiments, mobile device 48 determines its own three-dimensional (i.e., global) position based on the GPS data and altitude data and reports the three-dimensional location to BMS controller 12. BMS controller 12 may be configured to associate the three-dimensional location with the device identifier and to store the association in a locations database 46 (step 510).

Figure 6A:
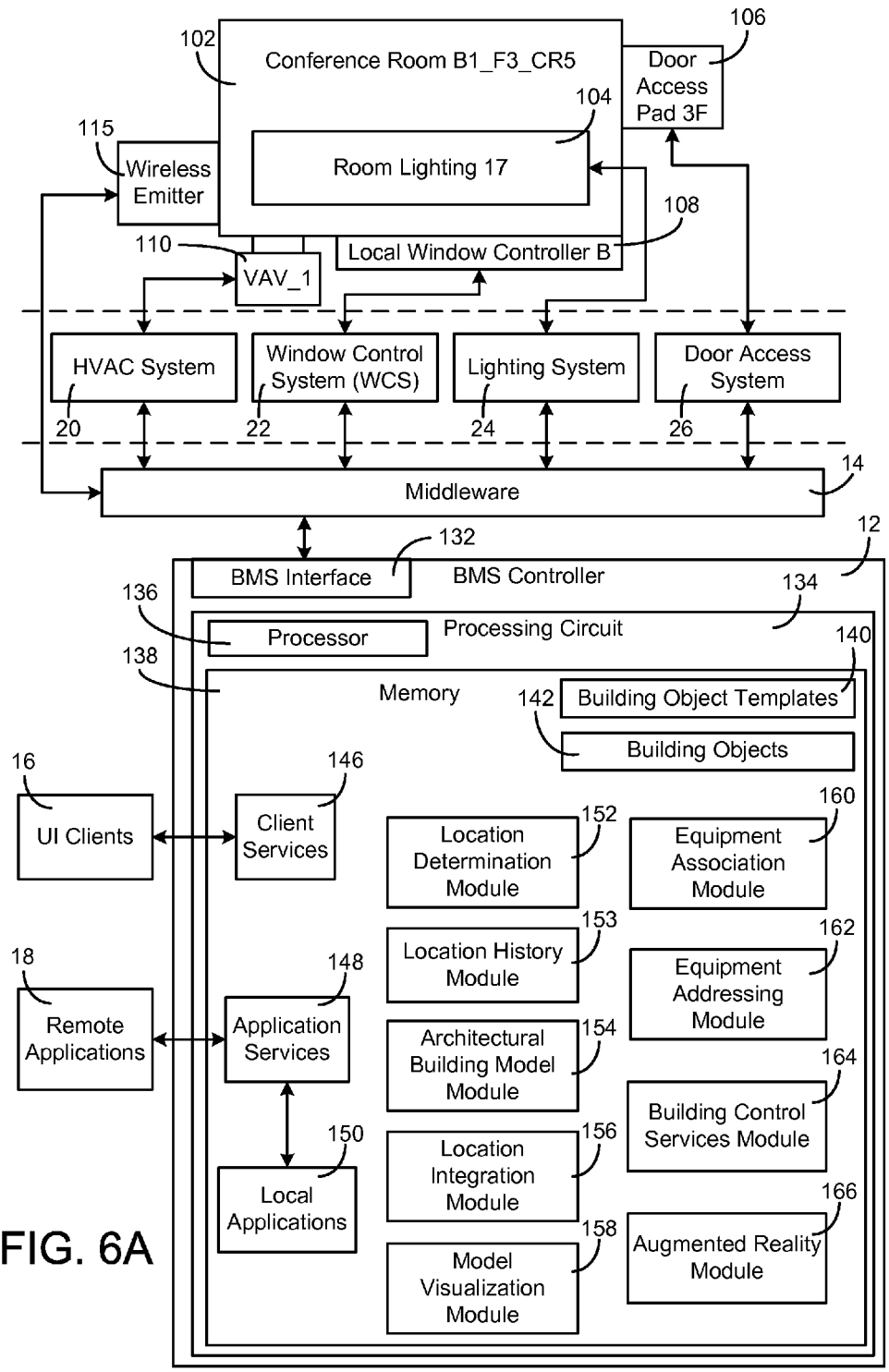
FIG. 6A is a block diagram illustrating a portion of the BMS of FIG. 2 in greater detail, according to an exemplary embodiment.

Referring now to FIG. 6A, a block diagram illustrating a portion of BMS 11 in greater detail is shown, according to an exemplary embodiment. Particularly, FIG. 6A illustrates a portion of BMS 11 that services a conference room 102 of building 10 (named "B1_F3_CR5"). Conference room 102 may be affected by many different building devices connected to many different BMS subsystems. For example, conference room 102 includes or is otherwise affected by VAV box 110, window controller 108 (e.g., a blind controller), a system of lights 104 (named "Room Lighting 17"), and a door access pad 106.

Each of the building devices shown at the top of FIG. 6A may include local control circuitry configured to provide signals to their supervisory controllers or more generally to the BMS subsystems 20-26. The local control circuitry of the building devices shown at the top of FIG. 6A may also be configured to receive and respond to control signals, commands, setpoints, or other data from their supervisory controllers. For example, the local control circuitry of VAV box 110 may include circuitry that affects an actuator in response to control signals received from a field controller that is a part of HVAC system 20. Window controller 108 may include circuitry that affects windows or blinds in response to control signals received from a field controller that is part of window control system (WCS) 22. Room lighting 104 may include circuitry that affects the lighting in response to control signals received from a field controller that is part of lighting system 24. Access pad 106 may include circuitry that affects door access (e.g., locking or unlocking the door) in response to control signals received from a field controller that is part of door access system 26.

Still referring to FIG. 6A, a wireless emitter 115 is shown located in proximity to conference room 102. In various embodiments, wireless emitter 115 may be located within conference room 102 (e.g., attached to a wall or ceiling, integrated with other BMS devices, etc.) or outside conference room 102 (e.g., in a hallway, in an adjacent room in the same zone, etc.). Wireless emitter 115 may be associated with conference room 102 by BMS controller 12. For example, BMS controller 12 may manage a relational database which associates each of wireless emitters/receivers 15 with a particular room or building zone. BMS controller 12 may be configured to associate a BMS device with conference room 102 in response to the BMS device reporting an emitter identifier associated with wireless emitter 115.

Still referring to FIG. 6A, BMS controller 12 is shown to include a BMS interface 132 in communication with middleware 14. In some embodiments, BMS interface 132 is a communications interface. For example, BMS interface 132 may include wired or wireless interfaces (e.g., jacks, antennas, transmitters, receivers, transceivers, wire terminals, etc.) for conducting data communications with various systems, devices, or networks. BMS interface 132 can include an Ethernet card and port for sending and receiving data via an Ethernet-based communications network. In another example, BMS interface 132 includes a WiFi transceiver for communicating via a wireless communications network. BMS interface 132 may be configured to communicate via local area networks or wide area networks (e.g., the Internet, a building WAN, etc.).

In some embodiments, BMS interface 132 and/or middleware 14 includes an application gateway configured to receive input from applications running on client devices.

For example, BMS interface 132 and/or middleware 14 may include one or more wireless transceivers (e.g., a WiFi transceiver, a Bluetooth transceiver, a NFC transceiver, a cellular transceiver, etc.) for communicating with client devices. BMS interface 132 may be configured to receive building management inputs from middleware 14 or directly from one or more BMS subsystems 20-26. BMS interface 132 and/or middleware 14 can include any number of software buffers, queues, listeners, filters, translators, or other communications-supporting services.

Still referring to FIG. 6A, BMS controller 12 is shown to include a processing circuit 134 including a processor 136 and memory 138. Processor 136 may be a general purpose or specific purpose processor, an application specific integrated circuit (ASIC), one or more field programmable gate arrays (FPGAs), a group of processing components, or other suitable processing components. Processor 136 is configured to execute computer code or instructions stored in memory 138 or received from other computer readable media (e.g., CDROM, network storage, a remote server, etc.).

Memory 138 may include one or more devices (e.g., memory units, memory devices, storage devices, etc.) for storing data and/or computer code for completing and/or facilitating the various processes described in the present disclosure. Memory 138 may include random access memory (RAM), read-only memory (ROM), hard drive storage, temporary storage, non-volatile memory, flash memory, optical memory, or any other suitable memory for storing software objects and/or computer instructions. Memory 138 may include database components, object code components, script components, or any other type of information structure for supporting the various activities and information structures described in the present disclosure. Memory 138 may be communicably connected to processor 136 via processing circuit 134 and may include computer code for executing (e.g., by processor 136) one or more processes described herein. When processor 136 executes instructions stored in memory 138 for completing the various activities described herein, processor 136 generally configures BMS controller 12 (and more particularly processing circuit 134) to complete such activities.

Still referring to FIG. 6A, memory 138 is shown to include building objects 142 and building object templates 140. In some embodiments, BMS controller 12 uses building objects 142 to group otherwise ungrouped or unassociated devices so that the group may be addressed or handled by applications together and in a consistent manner (e.g., a single user interface for controlling all of the BMS devices that affect a particular building zone or room). In some embodiments, BMS controller 12 creates and/or stores a building object in memory 138 for each zone or room of building 10. Each of building objects 142 may include the same or similar attributes, properties, and/or method names. For example, each of building objects 142 may include a variable air volume box attribute, a window attribute, a lighting attribute, a door access device attribute, a temperature attribute, a security level attribute, an occupancy attribute, a setpoint attribute, or any other type of attribute. Building objects 142 can be accessed by UI clients 16 and remote applications 18 to provide a comprehensive user interface for controlling and/or viewing information for a particular building zone.

Building object templates 142 may be used to construct building objects of predefined types. For example, building object templates 140 may contain a "Conference Room" template that can be used to define conference room objects in building objects 142. To create a building object for conference room 102, inputs from building management resources may be mapped (e.g., linked, associated, described, grouped) to attributes of the building object. For example, BMS controller 12 may group inputs from the various subsystems 20-26 to create a building object "Conference_Room.B1_F3_CR5" for conference room 102. An exemplary building object for conference room 102 might be an object such as:

```
Conference_Room.B1_F3_CR5 {
    vav:           //Middleware/HVAC_System_A/VAV_1;
    window:        //Middleware/WCS/WindowControllerB;
    lighting:      //Middleware/LightingSystem/RL12;
    door_access:   //Middleware/AccessSys/DAP3F;
}
```

The exemplary building object provided above is named "Conference_Room.B1_F3_CR5," which may conform to a naming convention indicating that it is a conference room in a particular location in the building (e.g. Conference Room 5 on Floor 3 of Building 1). The building object "Conference_Room.B1_F3_CR5" has several values or attributes including vav, window, lighting, and door access. The attributes of vav, window, lighting, and door access are mapped to the particular BMS resources of "HVAC_System_A/VAV_1," "WCS/WindowControllerB," "LightingSystem/RL12," and "AccessSys/DAP3F," respectively. The mapping provides a description for BMS or computing resources (e.g., back end software applications, client applications, BMS control routines, etc.) so that the BMS or other computing resources can identify, access, display, change or otherwise interact with the software defined building object in a meaningful way (e.g., in a way that allows changes to be made to the mapped devices).

Building objects 142 may be mapped to BMS inputs manually or automatically. For example, the mapping may be completed by a user with a graphical user interface tool that requires a user to either type in or "drag and drop" BMS inputs to an object. Building objects 142 may also or alternatively be mapped to BMS inputs by computerized systems configured to provide varying degrees of mapping automation. For example, patent application Ser. No. 12/887,390, filed Sep. 21, 2010 describes systems and methods for creating software defined building objects and mapping BMS inputs to the building objects. Once building objects 142 are created and BMS devices or inputs are mapped thereto, building objects 142 may be used by applications (e.g., local applications, remote applications, etc.) with any suitable programming language or syntax.

Still referring to FIG. 6A, memory 138 is shown to include client services 146 and application services 148. Client services 146 may be configured to facilitate interaction and/or communication between BMS controller 12 and various internal or external clients or applications. For example, client services 146 may include web services or application programming interfaces available for communication by UI clients 16 and remote applications 18 (e.g., applications running on a mobile device, energy monitoring applications, applications allowing a user to monitor the performance of the BMS, automated fault detection and diagnostics systems, etc.). Application services 148 may facilitate direct or indirect communications between remote applications 18, local applications 150, and BMS controller 12. For example, application services 148 may allow BMS controller 12 to communicate (e.g., over a communications network) with remote applications 18 running on mobile devices (e.g., mobile device 48) and/or with other BMS controllers.

In some embodiments, application services 148 facilitate an applications gateway for conducting electronic data communications with UI clients 16 and/or remote applications 18. For example, application services 148 may be configured to receive communications from mobile devices and/or BMS devices. Communications may include detected emitter identifiers, GPS data, altimeter data, accelerometer data, and/or other data from mobile device 48 or BMS devices 44. Client services 146 may provide client devices with a graphical visualization (e.g., a three-dimensional model, an augmented reality overlay, etc.) of building 10 with the locations of various BMS devices represented in the graphical visualization (described in greater detail below).

Still referring to FIG. 6A, memory 138 is shown to include a location determination module 152. Location determination module 152 may be configured to determine the location of building equipment in or around building 10. In some embodiments, location determination module 152 determines the location of building equipment device based on information received from the building equipment. For example, location determination module 152 may receive one or more emitter identifiers reported by the building equipment, as described with reference to FIG. 3.

Location determination module 152 may receive a single emitter identifier from the building equipment or multiple emitter identifiers from the building equipment. For example, a BMS device may report the emitter identifier associated with each wireless signal (e.g., from one of wireless emitters/receivers 15) that is detected by the BMS device. If the BMS device is within range of multiple wireless emitters/receivers 15, the BMS device may report multiple emitter identifiers. For embodiments in which the BMS device reports multiple emitter identifiers, each emitter identifier may be reported in conjunction with a signal strength. The signal strength associated with an emitter identifier may indicate a relative proximity of the BMS device to the corresponding wireless emitter (e.g., high signal strengths indicating a closer proximity and low signal strengths indicating a more distant proximity).

Location determination module 152 may determine the location of a BMS device based on the emitter identifier or emitter identifiers received from the BMS device. In some embodiments, location determination module 152 uses the emitter identifier(s) received from a BMS device to determine which of the plurality of wireless emitters/receivers 15 is closest to the BMS device (e.g., based on signal strength, triangulation, etc.). For example, location determination module 152 may use an emitter identifier received from a BMS device as an input to a relational database (e.g., a lookup table, a device mapping, etc.). Each emitter identifier may uniquely indicate a particular wireless emitter (e.g., by emitter device name, by serial number, etc.) and/or a particular location (e.g., a zone name, a zone identifier, etc.) in the relational database.

In some embodiments, location determination module 152 receives GPS data and/or altimeter data from the building equipment. For example, various BMS devices may be equipped with GPS receivers and/or altimeters. The BMS devices may report location information (e.g., GPS data and altitude data) and a device identifier to location determination module 152. Location determination module 152 may use the location information and the device identifier to determine a three-dimensional location of the BMS device 44. Location determination module 152 may be configured to associate the three-dimensional location with the device identifier and to store the association in a locations database.

In some embodiments, location determination module 152 receives GPS data and/or altimeter data from a mobile device. The mobile device may be transported to the physical location of the building equipment within building 10. The mobile device may obtain location information (e.g., GPS data and altitude data) and report the location information to location determination module 152. In various embodiments, the mobile device records a GPS location and/or altitude at the location of the building equipment or at an entrance of the building (e.g., for embodiments in which the GPS signal is too weak to determine obtain a GPS measurement within building 10). The mobile device may include an accelerometer configured to collect data from which a change in position can be determined. The mobile device may report the accelerometer data to location determination module 152. Location determination module 152 may combine the location information at the building entrance with the change in position between the building entrance and the location of the building equipment to determine the three-dimensional location of the building equipment within building 10.

Still referring to FIG. 6A, memory 138 is shown to include a location history module 153. Location history module 153 may be configured to create and/or manage a location history for devices within building 10 (e.g., BMS devices, mobile devices, client devices, etc.). A location history for a particular device may include a series of locations (e.g., determined by location determination module 152) at which the device has been located in the past. Location history module 153 may record the locations determined by location determination module 152 for each device in a database such that a location history for a particular device can be constructed.

The location history for a mobile device may facilitate automatically selecting a user interface for monitoring and/or controlling a particular room or zone in a building, even if the mobile device is not currently in the room or zone. For example, the location history for a mobile device may be used to provide a user with a list of control interfaces from which the user can select for presentation on the mobile device. Each control interface may correspond to a building zone in which the mobile device was previously located or is currently located. This feature allows a user to readily select a control interface for a recently-visited building zone (e.g., within a predetermined time period, within a threshold number of most recently-visited locations, etc.) regardless of whether the mobile device is currently located within the building zone.

In some embodiments, location history module 153 stores each location in the location history with a corresponding time parameter. The time parameter may be combined with the three-dimensional location information for a device to generate four-dimensional coordinates for a device (e.g., three location coordinates and a time coordinate; two location coordinates, a floor parameter, and a time parameter, etc.). In some embodiments, location history module 153 stores each location determined by location determination module 152 as an event. Each event may include location information (e.g., two-dimensional or three-dimensional location coordinates, etc.), a time parameter (e.g., identifying a time at which the mobile device was located at the indicated location), and a device ID parameter (e.g., indicating a particular device). By storing each location as an event, location history module 153 can maintain a historical record of the location of a device over a period of time.

In some embodiments, location history module 153 may be configured to use the location history for a mobile device to reconstruct a route that the mobile device travels within building 10. For example, location history module 153 can use the location history for a mobile device assigned to security personnel to determine whether the building personnel have physically traveled to various locations within building 10 at the appropriate times (e.g., for performing security checks, for personnel management, for responding to emergencies, etc.). As another example, the location history for a mobile device may allow a user's route from one building zone to another building zone to be reconstructed. This feature may be useful for providing navigation instructions (e.g., directions from one room in the building to another) for situations in which a user is not familiar with a layout of the building. The location history for a mobile device may also be used in the event of an emergency (e.g., a fire or fire drill) to determine whether all personnel who entered the building on a particular day (e.g., the day of the emergency) have been safely evacuated.

Still referring to FIG. 6A, memory 138 is shown to include an architectural building model module 154. Architectural building model module 154 may be configured to generate or obtain a three-dimensional architectural model of building 10. The architectural building model may specify the physical structures and dimensions of building 10 (e.g., interior and exterior wall locations, window locations, stair/elevator locations, room dimensions, etc.). In some embodiments, architectural building model module 154 uses existing blueprints or floor plans for building 10 to generate the architectural building model. For example, architectural building model module 154 may receive a scanned or imported image of a blueprint or floor plan. Architectural building model module 154 may analyze the blueprints or floor plans to generate a three-dimensional model of building 10. In other embodiments, architectural building model module 154 imports the three-dimensional model from a CAD file (e.g., .dxf drawings) or drawing generated by architecture software or design software.

In some embodiments, architectural building model module 154 can be used to create a new architectural building model (e.g., generating a new model based on user input). For example, a user may interact with architectural building model module 154 to specify building dimensions (e.g., overall building dimensions, room dimensions, wall locations, etc.) and other physical or architectural attributes of building 10.

In some embodiments, architectural building model module 154 generates a new architectural building model based on optical imaging or other automated measurements of building 10. For example, a mobile device can be used to measure wall locations and other physical structures (e.g., door locations, ceiling heights, stair locations, etc.) within building 10 using any of a variety of positioning or ranging techniques (e.g., optical sensing, radar, sonar, lidar, etc.). The location of the mobile device can be determined using any of the methods described above with reference to location determination module 152.

The mobile device may report location information (e.g., GPS coordinates, accelerometer data, altitude data, etc.), orientation information (e.g., a direction that the mobile device is facing) and structure detection information to architectural building model module 154 at multiple different locations within building 10. Architectural building model module 154 may generate a three-dimensional building model based on the location/orientation of the mobile device and the measured distances to various structures within building 10 at each of a plurality of measurement locations. Architectural building model module 154 may store the architectural building model in a database.

Still referring to FIG. 6A, memory 138 is shown to include a location integration module 156. Location integration module 156 may be configured to integrate (e.g., apply, combine, merge, etc.) the architectural building model provided by architectural building model module 154 with the BMS device location information provided by location determination module 152. For example, the location information provided by location determination module 152 may define the locations of BMS devices as points floating in three-dimensional space. Location integration module 156 may apply the locations of the BMS devices to the architectural building model to map each three-dimensional location to a particular location within building 10.

In some embodiments, the BMS device location information defines the locations of the BMS devices according to a first coordinate system and the architectural model defines the architecture of building 10 according to a second coordinate system. Location integration module 156 may merge the first coordinate system with the second coordinate system to generate an integrated model that includes both a three-dimensional architectural representation of building 10 and the locations of various BMS devices.

In some embodiments, location integration module 156 receives calibration data. The calibration data may identify a point in the building architectural model (e.g., a three-dimensional location) that corresponds to a particular point relative to the locations of the BMS devices (i.e., a shared point between the first coordinate system and the second coordinate system). The calibration data may include multiple calibration points measured at various locations in or around building 10 (e.g., a location measured at a southwest corner of building 10, a location measured at a northeast corner of building 10, etc.). Location integration module 156 may use the calibration data to scale and/or orient the building architectural model relative to the floating points representing the three-dimensional locations of various BMS devices. Location integration model 152 may generate an integrated building model (e.g., a three-dimensional architectural model) that defines the architecture of building 10 and specifies the locations of BMS devices relative to the architecture of building 10 (e.g., within a wall, in a particular room or zone, on the roof, etc.).

Figure 7:
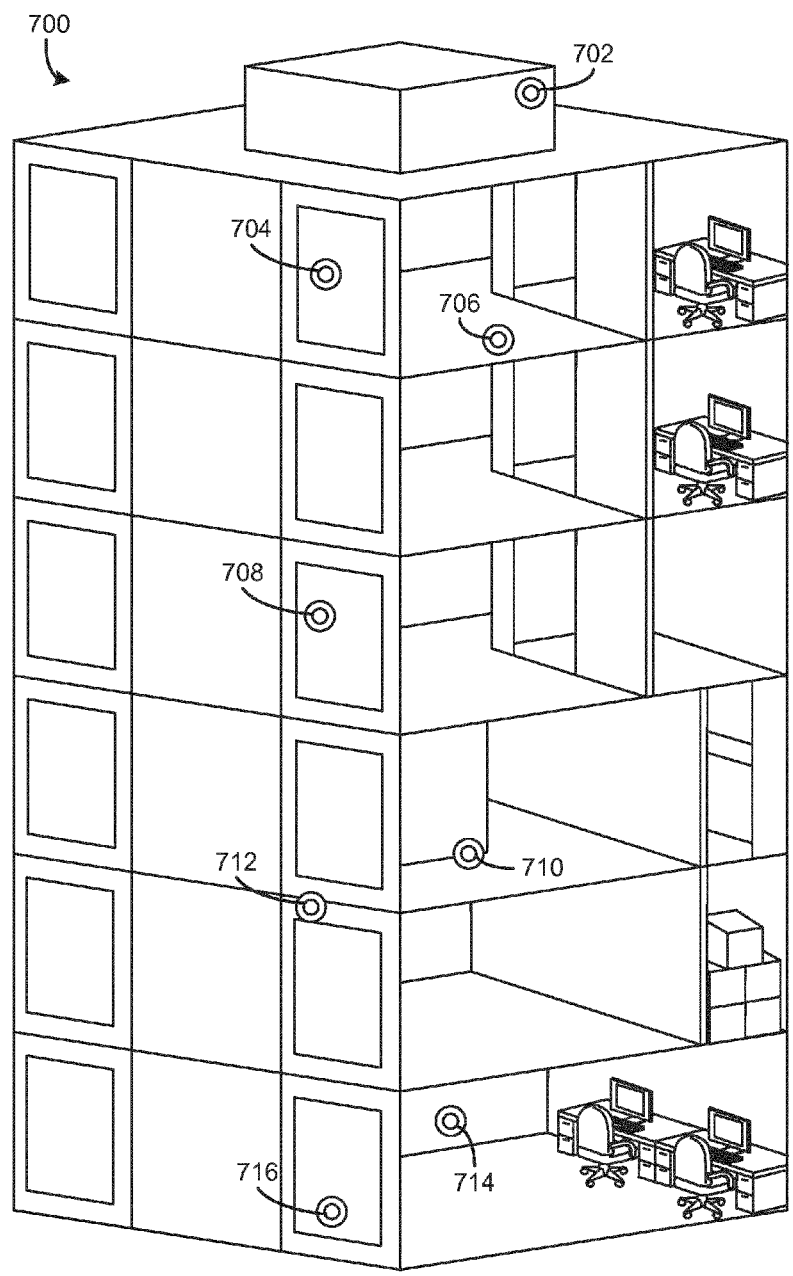
FIG. 7 is a drawing of a graphical visualization of an integrated building model including an architectural model of the building of FIG. 1 and the locations of building equipment relative to the architectural model, according to an exemplary embodiment.

Still referring to FIG. 6A, memory 138 is shown to include a model visualization module 158. Model visualization module 158 may be configured to generate or provide a graphical user interface (GUI) for visualizing the integrated model generated by location integration module 156. Model visualization model 158 may generate a GUI that includes a three-dimensional architectural model of building 10 with the locations of various BMS devices represented visually in the three-dimensional architectural model. The location of each BMS device may be shown relative to the architecture of building 10. An example of a graphical visualization that can be generated by model visualization model 158 is shown in FIG. 7.

In some embodiments, model visualization module 158 represents BMS devices using three-dimensional objects in the graphical visualization. For example, model visualization module 158 may access the device identifiers stored in locations database 46 to identify a type of device located at each of the indicated locations in the integrated model.

Model visualization module 158 may retrieve three-dimensional representations of one or more device types (e.g., a CAD model of a chiller, a CAD model of an AHU, etc.) and insert the three-dimensional representations at the specified locations in the integrated model. For example, model visualization module 158 may represent a chiller in the graphical visualization using a three-dimensional model of a chiller positioned at the location in building 10 associated with the chiller.

In some embodiments, the model visualization module 158 represents BMS devices in the graphical visualization according to equipment-specific attributes and/or status. For example, model visualization module 158 may interact with local applications 150 (e.g., a fault detection application) to identify fault indications for the BMS devices. In some embodiments, model visualization module 158 visually represents a detected fault by manipulating a visual attribute of the corresponding BMS device (e.g., highlighting BMS devices with detected faults, representing BMS devices with detected faults as flashing red, etc.). In some embodiments, model visualization module 158 adjusts the visual appearance of BMS devices in the graphical visualization based on an operating status (e.g., active, inactive, etc.) or performance metric (e.g., energy consumption, efficiency, etc.). For example, BMS devices that are operating efficiently may be represented using a first color (e.g., green or blue) whereas BMS devices that are operating inefficiently may be represented using a second color (e.g., yellow, orange, or red).

In some embodiments, model visualization module 158 represents relationships between BMS devices in the graphical visualization. For example, related BMS devices (e.g., an AHU and a VAV box that receives airflow from the AHU) may be visually associated in the graphical visualization (e.g., connected by a line, represented using the same color, etc.). In some embodiments, model visualization module 158 is configured to adjust the graphical visualization to allow a user to view relationships between BMS devices. For example, model visualization module 158 may highlight or emphasize BMS devices that are related to a user-selected BMS device.

The visualization provided by model visualization module 158 may facilitate locating a particular BMS device for service or maintenance. For example, service personnel can access the GUI provided by model visualization module 158 to identify a specific location of a faulty BMS device (e.g., above a particular ceiling tile, within a wall six feet from the corner of a room, etc.). The specific locations provided by model visualization module 158 define the locations of BMS devices more precisely and more accurately relative to traditional systems (e.g., systems which specify only a room location or general physical location). Advantageously, the specific locations provided by model visualization module 158 may allow BMS devices to be readily located without requiring service personnel to search in a general location.

Model visualization module 158 may interact with client services 146, application services 148, and/or local applications 150 to provide the visualization of the integrated model to local or remote clients (e.g., UI clients 16, remote applications 18, etc.). A user can access the graphical visualization locally or remotely to view the attributes, status, relationships, locations, and other information associated with various BMS devices.

Still referring to FIG. 6A, memory 138 is shown to include an equipment association module 160. Equipment association module 160 may be configured to automatically associate BMS devices and/or recommend device associations based on the locations of the BMS devices. Equipment association module 160 may generate associations between BMS devices (i.e., associating one BMS device with another BMS device) or between a BMS device and a building zone. For each BMS device, equipment association module 160 may determine one or more nearby BMS devices based on the device locations determined by location determination module 152.

In some embodiments, equipment association module 160 populates a list of nearby BMS devices (e.g., sorted by Euclidian distance). Equipment association module 160 may populate a relationship table with nearby devices that could potentially be related. For example, if the BMS device is a thermostat, the relationship table may include a potential relationship between the thermostat and a nearby VAV box. In some embodiments, equipment association module 160 suggests a list of likely relationships between BMS devices (e.g., ranked based on distance and/or relevance) for a user to confirm or reject. In other embodiments, equipment association module 160 automatically associates BMS devices without requiring user intervention.

In some embodiments, equipment association module 160 generates associations between BMS devices and building zones. Equipment association module 160 may identify a room or zone in which a BMS device is located using the integrated architectural model generated by location integration module 156. In some embodiments, equipment association module 160 automatically generates a building object for the building zone (e.g., using building object templates 140). Equipment association module 160 may associate a nearby BMS device with the building zone by adding an input or output of the BMS device as an attribute of the building zone.

In some embodiments, equipment association module 160 provides a GUI to a user (e.g., a service or installation technician) to facilitate forming associations between BMS devices and/or building zones. The GUI may display recommended device associations based on the location of the equipment. For example, the GUI may include the integrated three-dimensional model generated by location integration module 154. Recommended device associations may be shown by lines (e.g., augmented reality lines) connecting BMS devices in the integrated model. The user can confirm or reject the recommended associations via the GUI.

Advantageously, the location-based equipment associations formed or recommended by equipment association module 160 may facilitate automated device pairing for wireless devices. For example, equipment association module 160 may automatically associate a wireless thermostat with a particular building zone or with another BMS device (e.g., a VAV box for the room in which the thermostat is located) based on the location of the wireless thermostat in building 10. If the wireless thermostat is located in the same room or zone as a VAV box, equipment association module 160 may automatically associate the wireless thermostat with the VAV box.

Still referring to FIG. 6A, memory 138 is shown to include an equipment addressing module 162. Equipment addressing module 162 may be configured to automatically address building equipment based on the location of the equipment. Equipment addressing module 162 may access locations database 46 to determine the locations of BMS devices in building 10. Equipment addressing module 162 may assign unique parameters to building equipment (e.g., a MAC address, a device name, a device identifier, etc.) during commissioning and/or installation (e.g., a new installation or a retrofit installation). The unique parameters assigned to a BMS device by equipment addressing module 162 may be guaranteed to be different for various BMS devices.

Equipment addressing module 162 may assign a device name to a BMS device according to a naming convention based on the location of the BMS device and/or the room or building zone in which the BMS device is located. For example, equipment addressing module 162 may name a VAV box "VAV.B1_F3_CR5" if the VAV box is located in conference room 5 on floor 3 of building 1. Advantageously, automatically assigning device names to various BMS devices avoids requiring technicians to set unique addresses for all equipment using a manual dip switch.

Still referring to FIG. 6A, memory 138 is shown to include a building control services module 164. Building control services module 164 may be configured to automatically control BMS 11 and the various subsystems thereof. Building control services module 164 may utilize closed loop control, feedback control, PI control, model predictive control, or any other type of automated building control methodology to control the environment (e.g., a variable state or condition) within building 10.

Building control services module 164 may receive inputs from sensory devices (e.g., temperature sensors, pressure sensors, flow rate sensors, humidity sensors, electric current sensors, cameras, radio frequency sensors, microphones, etc.), user input devices (e.g., computer terminals, client devices, user devices, etc.) or other data input devices via BMS interface 132. Building control services module 164 may apply the various inputs to a building energy use model and/or a control algorithm to determine an output for one or more building control devices (e.g., dampers, air handling units, chillers, boilers, fans, pumps, etc.) in order to affect a variable state or condition within building 10 (e.g., zone temperature, humidity, air flow rate, etc.).

In some embodiments, building control services module 164 is configured to control the environment of building 10 on a zone-individualized level. For example, building control services module 164 may control the environment of two or more different building zones using different setpoints, different constraints, different control methodology, and/or different control parameters. Building control services module 164 may operate BMS 11 to maintain building conditions (e.g., temperature, humidity, air quality, etc.) within a setpoint range, to optimize energy performance (e.g., to minimize energy consumption, to minimize energy cost, etc.), and/or to satisfy any constraint or combination of constraints as may be desirable for various implementations.

In some embodiments, building control services module 164 uses the location of various BMS devices to translate an input received from a building system into an output or control signal for the building system. Building control services module 164 may receive location information for BMS devices from location determination module 152. In some embodiments, building control services module 164 automatically sets or recommends control parameters for the BMS devices based on the locations of the BMS devices. For example, building control services module 164 may automatically set a flow rate setpoint for a VAV box based on the size of the building zone in which the VAV box is located.

Building control services module 164 may determine which of a plurality of sensors to use in conjunction with a feedback control loop based on the locations of the sensors within building 10. For example, building control services module 164 may use a signal from a temperature sensor located in a building zone as a feedback signal for controlling the temperature of the building zone in which the temperature sensor is located.

In some embodiments, building control services module 164 automatically generates control algorithms for a controller or a building zone based on the location of the zone in the building 10. For example, building control services module 164 may be configured to predict a change in demand resulting from sunlight entering through windows based on the orientation of the building and the locations of the building zones (e.g., east-facing, west-facing, perimeter zones, interior zones, etc.).

Building control services module 164 may use zone location information and interactions between adjacent building zones (rather than considering each zone as an isolated system) to more efficiently control the temperature and/or airflow within building 10. For control loops that are conducted at a larger scale (i.e., floor level) building control services module 164 may use the location of each building zone and/or BMS device to coordinate control functionality between building zones. For example, building control services module 164 may consider heat exchange and/or air exchange between adjacent building zones as a factor in determining an output control signal for the building zones.

In some embodiments, building control services module 164 is configured to optimize the energy efficiency of building 10 using the locations of various BMS devices and the control parameters associated therewith. Building control services module 164 may be configured to achieve control setpoints using building equipment with a relatively lower energy cost (e.g., by causing airflow between connected building zones) in order to reduce the loading on building equipment with a relatively higher energy cost (e.g., chillers and roof top units). For example, building control services module 164 may be configured to move warmer air from higher elevation zones to lower elevation zones by establishing pressure gradients between connected building zones.

In some embodiments, building control services module 164 is configured to generate location-based energy savings recommendations for particular building zones. For example, building control services module 164 may determine a change in heating or cooling demand resulting from sunlight entering through windows of perimeter building zones based on the orientation of the building and the locations of the building zones. Building control services module 164 may recommend a control strategy for window control system 22 (e.g., opening and closing window shades at particular times) in order to reduce the amount of energy required to heat or cool the perimeter building zones.

Still referring to FIG. 6A, memory 138 is shown to include an augmented reality module 166. Augmented reality module 166 may be configured to generate an augmented reality display of the integrated model generated by location integration module 154. For example, augmented reality module 166 may be configured to generate an augmented reality view of the building equipment locations in the integrated model from the perspective of an observer (e.g., a mobile device) within building 10.

Augmented reality module 166 may generate a display of the building equipment superimposed or projected upon a live camera-derived image from a mobile device within building 10. The augmented reality display may allow a user to see building equipment that is hidden behind walls or located in a ceiling or floor. For example, a user can point a mobile device with a camera (e.g., a smart phone, a tablet, etc.) toward a wall that has building equipment located on the other side.

Augmented reality module 166 may be configured to determine the location and orientation of the mobile device in order to generate a view of the building equipment from the perspective of the mobile device. The location of the mobile device can be determined using any of the methods described above with reference to location determination module 152. The orientation of the mobile device can be determined using an accelerometer and/or compass integrated with the mobile device. For example, the mobile device may report location information (e.g., GPS coordinates, accelerometer data, altitude data, etc.) and orientation information (e.g., a direction that the mobile device is facing) to augmented reality module 166. Augmented reality module 166 may superimpose a view of the building equipment from the perspective of the mobile device upon the camera-derived image such that the building equipment is visible in the augmented reality display.

In some embodiments, augmented reality module 166 represents BMS devices in the augmented reality display according to equipment-specific attributes and/or status. For example, augmented reality module 166 may interact with local applications 150 (e.g., a fault detection application) to identify fault indications for the BMS devices. In some embodiments, augmented reality module 166 visually represents a detected fault by manipulating a visual attribute of the corresponding BMS device (e.g., highlighting BMS devices with detected faults, representing BMS devices with detected faults as flashing red, etc.).

In some embodiments, augmented reality module 166 adjusts the visual appearance of BMS devices in the augmented reality display based on an operating status (e.g., active, inactive, etc.) or performance metric (e.g., energy consumption, efficiency, etc.). For example, BMS devices that are operating efficiently may be represented using a first color (e.g., green or blue) whereas BMS devices that are operating inefficiently may be represented using a second color (e.g., yellow, orange, or red). In some embodiments, augmented reality module 166 represents relationships between BMS devices in the augmented reality display. For example, related BMS devices (e.g., an AHU and a VAV box that receives airflow from the AHU) may be visually associated in the augmented reality display (e.g., connected by an augmented reality line, etc.).

Advantageously, the augmented reality display provided by augmented reality module 166 may facilitate locating a particular BMS device for service or maintenance. For example, service personnel can use the augmented reality display to locate a faulty BMS device that is hidden from view (e.g., within a wall, above a ceiling tile, etc.). The augmented reality display may allow BMS devices to be readily located without requiring service personnel to search in a general location.

Figure 6B:
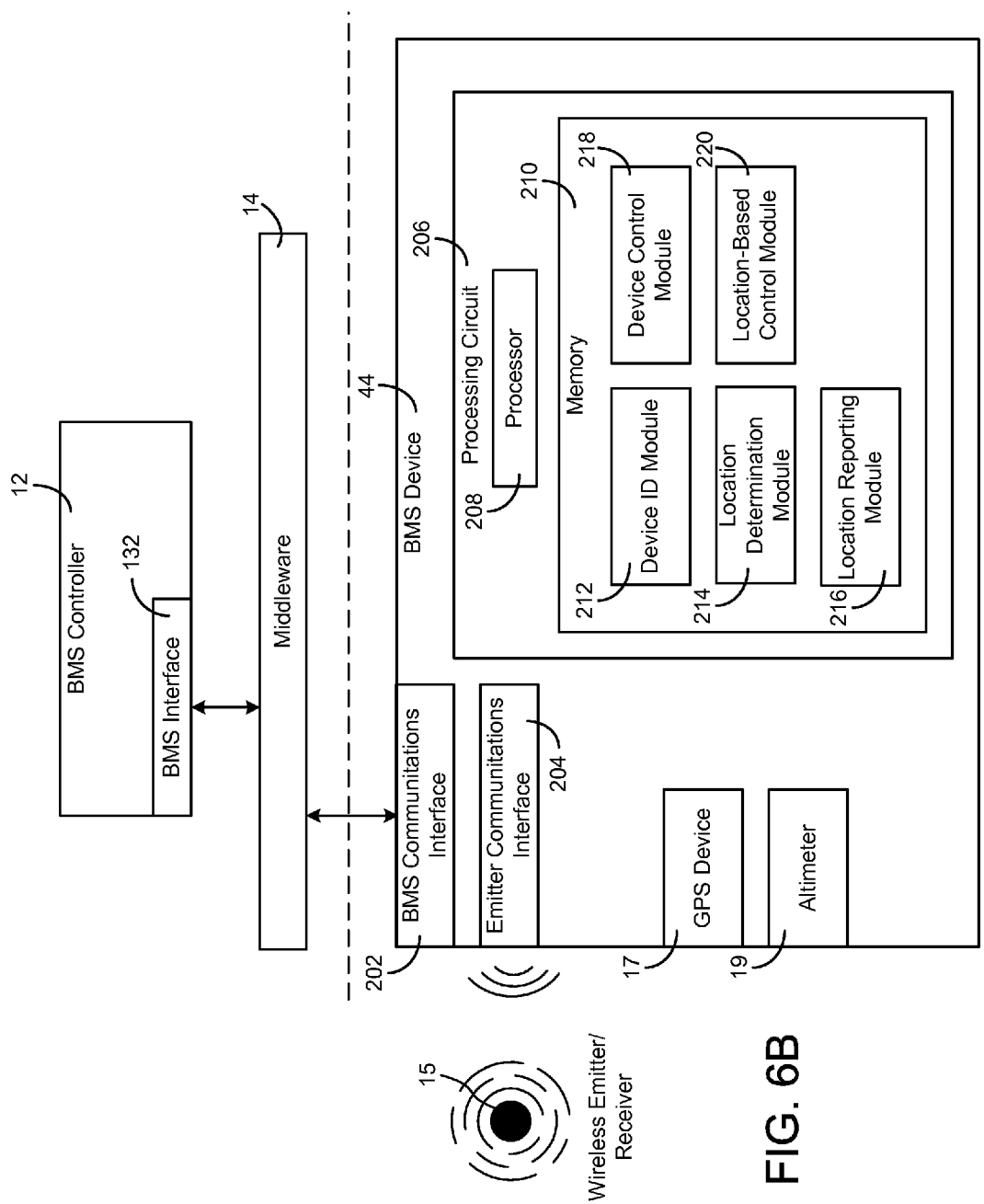
FIG. 6B is a block diagram illustrating the BMS device of FIGS. 3-5 in greater detail, according to an exemplary embodiment.

Referring now to FIG. 6B, a block diagram illustrating BMS device 44 in greater detail is shown, according to an exemplary embodiment. BMS device 44 may be any device of BMS 11 (e.g., a chiller, an AHU, a VAV, a thermostat, a shade controller, a HVAC controller, etc.) as previously described with reference to FIGS. 1-5. BMS device 44 may be configured to determine its own three-dimensional location and to report its three-dimensional location to BMS controller 12. In some embodiments, BMS device 44 is a SMART device configured to perform some or all of the data analysis and/or control functions required for controlling a portion of BMS 11 (e.g., zone level control). The control operations performed by BMS device 44 may be based on the location of BMS device 44 (e.g., location-based control) as determined automatically by BMS device 44 and/or BMS controller 12.

Still referring to FIG. 6B, BMS device 44 is shown to include a BMS communications interface 202. BMS communications interface 202 may include wired or wireless interfaces (e.g., jacks, antennas, transmitters, receivers, transceivers, wire terminals, etc.) for conducting data communications with various systems, devices, or networks of BMS 11. In some embodiments, BMS communications interface 202 is configured to communicate using the BACnet communications protocol. BMS communications interface 202 may facilitate direct or indirect electronic data communications with other components of BMS 11 (e.g., BMS controller 12, other BMS devices, etc.). In some embodiments, BMS communications interface 202 includes an Ethernet card and port for sending and receiving data via an Ethernet-based communications network and/or a WiFi transceiver for communicating via a wireless communications network. BMS communications interface 202 may be configured to communicate via local area networks or wide area networks (e.g., the Internet, a building WAN, etc.).

BMS communications interface 202 may be configured to receive building management inputs directly from BMS controller 12 or indirectly via middleware 14. Middleware 14 may include services that allow interoperable communication to, from, or between disparate BMS subsystems 20-26 of BMS 11 (e.g., HVAC systems from different manufacturers, HVAC systems that communicate according to different protocols, security/fire systems, IT resources, door access systems, etc.). Middleware 14 may be, for example, an EnNet server sold by Johnson Controls, Inc. BMS interface 132 and/or middleware 14 can include any number of software buffers, queues, listeners, filters, translators, or other communications-supporting services.

Still referring to FIG. 6B, BMS device 44 is shown to include an emitter communications interface 204. Emitter communications interface 204 may be configured to detect wireless signals emitted by wireless emitters/receivers 15 positioned at various locations within or around building 10. Emitter communications interface 204 may use any type wireless technology or communications protocol. For example, emitter communications interface 204 may be configured to detect wireless signals emitted by Bluetooth low energy (BLE) emitters, near field communications (NFC) devices, WiFi transceivers, RFID devices, ultrawide band (UWB) devices, infrared emitters/sensors, visible light communications (VLC) devices, ultrasound devices, cellular transceivers, iBeacons, or any other type of hardware configured to emit a wireless signal.

Emitter communications interface 204 may detect a wireless signal that includes an indication of an emitter identifier associated with a particular wireless emitter/receiver 15. In some embodiments, the wireless signal broadcast by emitter/receiver 15 include multiple emitter identifiers (e.g., a UUID value, a major value, a minor value, etc.). BMS device 44 may be configured to identify the emitter identifier(s) associated with the wireless signal received via emitter communications interface 204. The identified emitter identifier(s) may be used by BMS device 44 to determine its location within building 10.

Still referring to FIG. 6B, BMS device 44 is shown to include a GPS device 17 and an altimeter 19. GPS device 17 may include a GPS receiver in communication with GPS satellites. BMS device 44 may use GPS information received via GPS device 17 to determine its own geospatial position. In various embodiments, the information from GPS device 17 may be used to calculate a two-dimensional position (e.g., two-dimensional GPS coordinates, latitude and longitude, etc.) a three-dimensional position (e.g., GPS coordinates and an altitude), or a four-dimensional position (e.g., a three-dimensional location and a time).

Altimeter 19 may be configured to measure an altitude. In some embodiments, BMS device 44 uses altimeter data in conjunction with GPS data to determine its own three-dimensional location. For example, GPS device 17 may provide two-dimensional (e.g., horizontal) coordinates and altimeter 19 may provide a one-dimensional (e.g., vertical) altitude. BMS device 44 may combine the altimeter data and the GPS data to determine a three-dimensional location.

Still referring to FIG. 6B, BMS device 44 is shown to include a processing circuit 206 including a processor 208 and memory 210. Processor 208 may be a general purpose or specific purpose processor, an application specific integrated circuit (ASIC), one or more field programmable gate arrays (FPGAs), a group of processing components, or other suitable processing components. Processor 208 is configured to execute computer code or instructions stored in memory 210 or received from other computer readable media (e.g., CDROM, network storage, a remote server, etc.).

Memory 210 may include one or more devices (e.g., memory units, memory devices, storage devices, etc.) for storing data and/or computer code for completing and/or facilitating the various processes described in the present disclosure. Memory 210 may include random access memory (RAM), read-only memory (ROM), hard drive storage, temporary storage, non-volatile memory, flash memory, optical memory, or any other suitable memory for storing software objects and/or computer instructions. Memory 210 may include database components, object code components, script components, or any other type of information structure for supporting the various activities and information structures described in the present disclosure. Memory 210 may be communicably connected to processor 208 via processing circuit 206 and may include computer code for executing (e.g., by processor 208) one or more processes described herein. When processor 208 executes instructions stored in memory 210 for completing the various activities described herein, processor 208 generally configures BMS device 44 (and more particularly processing circuit 206) to complete such activities.

Still referring to FIG. 6B, memory 210 is shown to include a device ID module 212. Device ID module 212 may be configured to store a device identifier (i.e., a device ID) for BMS device 44. The device ID may be a device name (e.g., "Chiller A") or other identifier that distinguishes BMS device 44 from other BMS devices of BMS 11. In some embodiments, device ID module 212 stores device-specific attributes such as a serial number, an equipment model number, an equipment version, an equipment definition, or other information that identifies and/or defines BMS device 44.

The device ID information stored in device ID module 212 may identify a particular BMS device within a logical network (e.g., a data points network) managed by BMS controller 12. The device ID information may be reported to BMS controller 12 in conjunction with location information for BMS device 44. BMS controller 12 may use the device ID and location information to associate BMS device 44 with a particular location within building 10.

Still referring to FIG. 6B, memory 210 is shown to include a location determination module 214. Location determination module 214 may be the same or similar to location determination module 152, as described with reference to FIG. 6A. However, location determination module 214 is a component of BMS device 44 and can be used by BMS device 44 to automatically determine its own location without requiring interaction with BMS controller 12. Location determination module 214 may be configured to determine the location of BMS device 44 in or around building 10. In some embodiments, location determination module 214 determines the location of BMS device 44 using information received via emitter communications interface 202, GPS device 17, and/or altimeter 19.

Location determination module 214 may receive one or more emitter identifiers from emitter communications interface 204. For example, emitter communications interface 204 may detect emitter identifiers broadcast by nearby wireless emitters/receivers 15 and provide the detected emitter identifiers to location determination module 212. If BMS device 44 is within range of multiple wireless emitters/receivers 15, location determination module 214 may receive multiple emitter identifiers. For embodiments in which location determination module 214 receives multiple emitter identifiers, each emitter identifier may be received in conjunction with a signal strength. The signal strength associated with an emitter identifier may indicate a relative proximity of BMS device 44 to the corresponding wireless emitter (e.g., high signal strengths indicating a closer proximity and low signal strengths indicating a more distant proximity).

Location determination module 214 may determine the location of BMS device 44 based on the received emitter identifier or emitter identifiers. In some embodiments, location determination module 214 uses the emitter identifier(s) to determine which of the plurality of wireless emitters/receivers 15 is closest to BMS device 44 (e.g., based on signal strength, triangulation, etc.). For example, location determination module 214 may use an emitter identifier as an input to a relational database (e.g., a lookup table, a device mapping, etc.). Each emitter identifier may uniquely indicate a particular wireless emitter (e.g., by emitter device name, by serial number, etc.) and/or a particular location (e.g., a zone name, a zone identifier, etc.) in the relational database. Location determination module 214 may use the locations of the detected wireless emitters/receivers 15 to determine the location of BMS device 44.

In some embodiments, location determination module 214 receives GPS data and/or altimeter data from GPS device 17 and/or altimeter 19. Location determination module 214 may use the GPS information and/or altimeter information to determine a three-dimensional location of BMS device 44. Location determination module 214 may be configured to associate the three-dimensional location of BMS device 44 with the device identifier stored in device ID module 212 and to store the association in a locations database. The location of BMS device 44 determined by location determination module 214 may be used for location-based control functions (e.g., performed by location-based control module 220) and/or reported to BMS controller 12.

Still referring to FIG. 6B, memory 210 is shown to include a location reporting module 216. Location reporting module 216 may be configured to report the location of BMS device 44 to BMS controller 12. In various embodiments, location reporting module 216 may report a two-dimensional location (e.g., x and y coordinates, GPS coordinates, etc.), a three-dimensional location (e.g., x, y, and z coordinates, GPS coordinates and altimeter data, two-dimensional coordinates and a floor number, etc.), or a four-dimensional location, (e.g., x, y, and z coordinates and a time parameter;

GPS coordinates, altimeter data, and a time parameter; etc.). In some embodiments, location reporting module 216 reports the location of BMS device 44 as a relative location within building 10 (e.g., within particular room or zone, in a wall, ceiling, or floor, etc.).

In some embodiments, location reporting module 216 reports the location of BMS device 44 in conjunction with a device identifier. For example, location reporting module 216 may retrieve the device identifier from device ID module 212 and report the device ID along with the location information from location determination module 214. BMS controller 12 may use the device ID and location information to associate BMS device 44 with a particular location within building 10.

In some embodiments, location reporting module 216 reports information that can be used to determine the location of BMS device 44 (e.g., for embodiments in which BMS device 44 does not determine its own location). For example, location reporting module 216 may report one or more detected emitter identifiers, signal strengths associated with each detected emitter identifier, GPS data, altitude data, or other data obtained by BMS device 44. BMS controller 12 may use the reported information to determine the location of BMS device 44 as previously described with reference to FIG. 6A.

Still referring to FIG. 6B, memory 210 is shown to include a device control module 218. Device control module 218 may be configured to manage various control functions that can be performed by BMS device 44 to automatically control the environment within building 10 or a portion thereof. In some embodiments, device control module 218 performs control operations on a zone-specific level or device-specific level. Device control module 218 may allow BMS device to perform control operations without requiring an input signal from a supervisory controller such as BMS controller 12 (e.g., for embodiments in which BMS device 44 includes SMART equipment).

Device control module 218 may receive inputs from sensory devices (e.g., temperature sensors, pressure sensors, flow rate sensors, humidity sensors, electric current sensors, cameras, radio frequency sensors, microphones, etc.), user input devices (e.g., computer terminals, client devices, user devices, etc.) or other data input devices via BMS communications interface 202. Device control module 218 may apply the various inputs to a building energy use model and/or a control algorithm to determine an output for one or more building control devices (e.g., dampers, air handling units, chillers, boilers, fans, pumps, etc.) in order to affect a variable state or condition within building 10 (e.g., zone temperature, humidity, air flow rate, etc.). Device control module 218 may utilize closed loop control, feedback control, PI control, model predictive control, or any other type of automated building control methodology to control the environment (e.g., a variable state or condition) within building 10.

In some embodiments, device control module 218 is configured to control the environment of building 10 on a zone-individualized level. For example, device control module 218 may control the environment of two or more different building zones using different setpoints, different constraints, different control methodology, and/or different control parameters. Device control module 218 may operate one or more devices of BMS 11 to maintain building conditions (e.g., temperature, humidity, air quality, etc.) within a setpoint range, to optimize energy performance (e.g., to minimize energy consumption, to minimize energy cost, etc.), and/or to satisfy any constraint or combination of constraints as may be desirable for various implementations.

Still referring to FIG. 6B, memory 210 is shown to include a location-based control module 220. Location-based control module 220 may be configured to perform location-based control operations for BMS device 44. In some embodiments, location-based control module 220 uses the location of BMS device 44 to translate an input signal into an output or control signal. Location-based control module 220 may receive location information for BMS device 44 from location determination module 214. In some embodiments, location-based control module 220 automatically sets or recommends control parameters for BMS device 44 based on the location of BMS device 44 within building 10. For example, if BMS device 44 is a VAV box, location-based control module 220 may automatically set a flow rate setpoint for the VAV box based on the size of the building zone in which the VAV box is located.

Location-based control module 220 may determine which of a plurality of sensors to use in conjunction with a feedback control loop based on the locations of the sensors within building 10. For example, location-based control module 220 may use a signal from a temperature sensor located in a building zone as a feedback signal for controlling the temperature of the building zone in which the temperature sensor is located. Location-based control module 220 may automatically associate BMS device 44 with one or more input devices (e.g., sensors) and one or more control devices (e.g., actuators) based on the locations of the devices within building 10.

In some embodiments, location-based control module 220 automatically generates control algorithms for BMS device 44 based on the location of BMS device 44 in building 10. For example, location-based control module 220 may be configured to predict a change in demand resulting from sunlight entering through windows based on the orientation of the building and the locations of the building zones (e.g., east-facing, west-facing, perimeter zones, interior zones, etc.). Location-based control module 220 may adjust the control algorithms used be device control module 218 to control BMS device 44 based on the location of BMS device 44 within building 10.

Location-based control module 220 may use zone location information and interactions between adjacent building zones (rather than considering each zone as an isolated system) to more efficiently control the temperature and/or airflow within building 10. For control loops that are conducted at a larger scale (i.e., floor level) location-based control module 220 may use the location of BMS device 44 and other BMS devices to coordinate control functionality between building zones. For example, location-based control module 220 may consider heat exchange and/or air exchange between adjacent building zones as a factor in determining an output control signal for BMS device 44. Location-based control module 220 may adjust the output control signal provided to various devices based on the locations of such devices within building 10.

In some embodiments, location-based control module 220 is configured to optimize the energy efficiency of building 10 using the locations of various BMS devices and the control parameters associated therewith. Location-based control module 220 may be configured to achieve control setpoints using building equipment with a relatively lower energy cost (e.g., by causing airflow between connected building zones) in order to reduce the loading on building equipment with a relatively higher energy cost (e.g., chillers and roof top units). For example, location-based control module 220 may be configured to move warmer air from higher elevation zones to lower elevation zones by establishing pressure gradients between connected building zones.

In some embodiments, location-based control module 220 is configured to generate location-based energy savings recommendations for particular building zones. For example, location-based control module 220 may determine a change in heating or cooling demand resulting from sunlight entering through windows of perimeter building zones based on the orientation of the building and the locations of the building zones. Location-based control module 220 may recommend a control strategy for window control system 22 (e.g., opening and closing window shades at particular times) in order to reduce the amount of energy required to heat or cool the perimeter building zones.

Referring now to FIG. 7, a drawing of a graphical visualization 700 of building 10 is shown, according to an exemplary embodiment. Graphical visualization 700 may be generated by model visualization model 158, as described with reference to FIG. 6A. As shown in FIG. 7, graphical visualization 700 is a three-dimensional architectural model of building 10 with the locations of various BMS devices 702-716 represented visually in the three-dimensional architectural model. The location of each BMS device is shown relative to the architecture of building 10.

In some embodiments, graphical visualization 700 represents BMS devices using three-dimensional objects. For example, graphical visualization 700 may represent a chiller in using a three-dimensional model of a chiller positioned at the location in building 10 associated with the chiller. In some embodiments, graphical visualization 700 represents BMS devices according to equipment-specific attributes and/or status. For example, graphical visualization 700 may visually represent a detected fault by highlighting BMS devices with detected faults (e.g., flashing red, etc.). In some embodiments, graphical visualization 700 displays BMS devices based on an operating status (e.g., active, inactive, etc.) or performance metric (e.g., energy consumption, efficiency, etc.). For example, graphical visualization 700 may represent BMS devices that are operating efficiently may be represented in using a first color (e.g., green or blue) whereas BMS devices that are operating inefficiently may be represented using a second color (e.g., yellow, orange, or red).

In some embodiments, graphical visualization 700 represents relationships between BMS devices. For example, related BMS devices (e.g., an AHU and a VAV box that receives airflow from the AHU) may be visually associated in graphical visualization 700 (e.g., connected by a line, represented using the same color, etc.). In some embodiments, graphical visualization 700 is interactive. For example, graphical visualization 700 may allow a user to view relationships between BMS devices by selecting a BMS device (e.g., clicking on a device in graphical visualization 700, entering a device name, etc.). Devices that are related to the user-selected BMS device may be highlighted or emphasized in graphical visualization 700.

Figure 8:
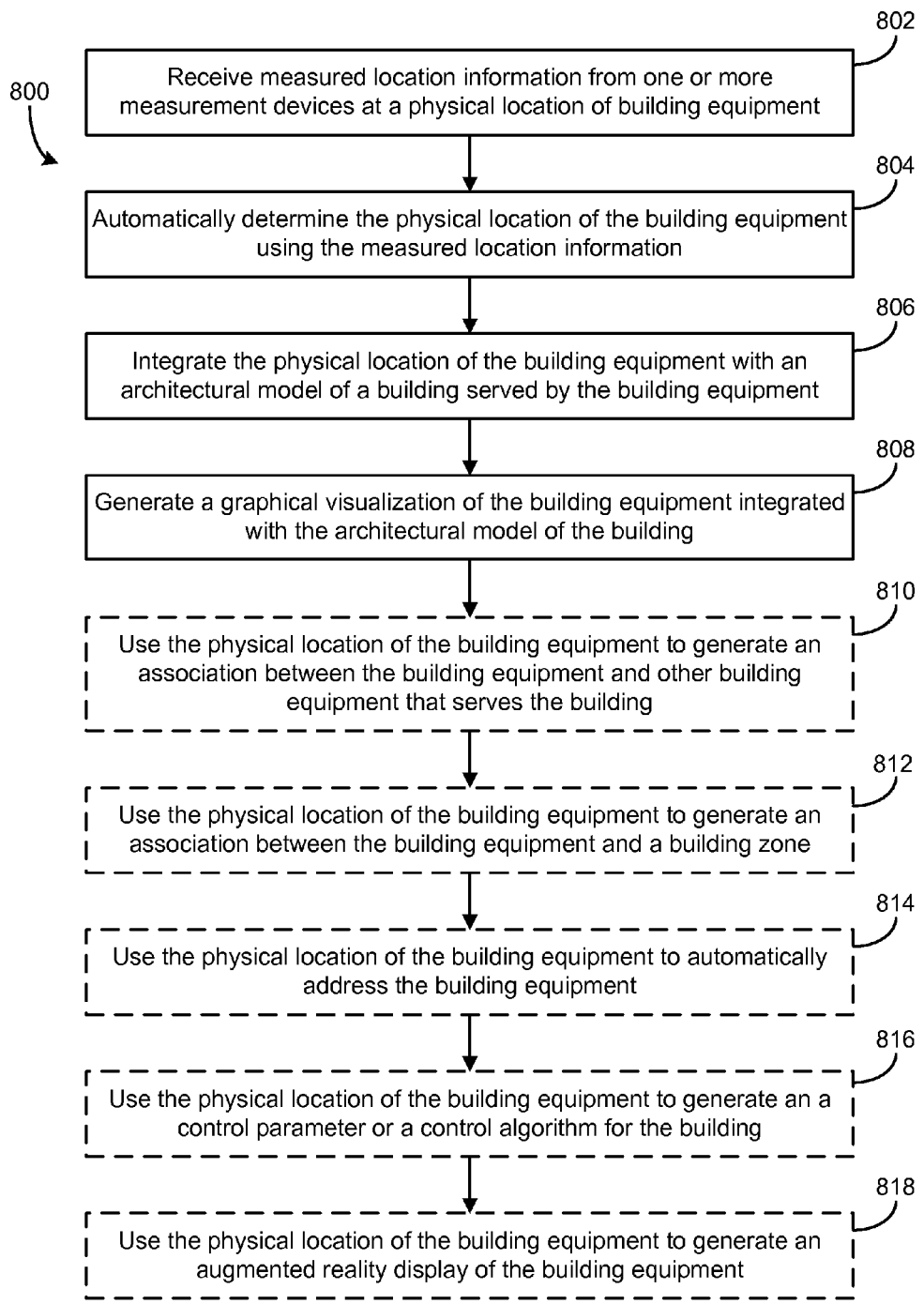
FIG. 8 is a flowchart of a process for detecting and using equipment location in a building management system, according to an exemplary embodiment.

Referring now to FIG. 8, a flowchart of a process 800 for detecting and using equipment location in a building management system is shown, according to an exemplary embodiment. In some embodiments, process 800 is performed by BMS controller 12, as described with reference to FIGS. 2-6. In brief overview, steps 802-808 illustrate a process for automatically determining a location of building equipment and generating a graphical visualization of the building equipment integrated with an architectural model of a building. Steps 810-818 illustrate several independent implementations which use the location of the building equipment. In various embodiments, some or all of steps 802-818 may be omitted from process 800, the sequence of steps may be rearranged, and/or two or more steps may be performed in parallel.

Still referring to FIG. 8, process 800 is shown to include receiving measured location information from one or more measurement devices at a physical location of building equipment (step 802). In various embodiments, the one or more measurement devices may include a GPS device, an altimeter, a wireless receiver (e.g., a WiFi transceiver, a Bluetooth transceiver, a NFC transceiver, etc.), an accelerometer, and/or other types of devices capable of measuring a location or a quantity from which location can be derived. For example, in some embodiments, the location information include GPS coordinates and an altitude measurement. In other embodiments, the location information includes an emitter identifier indicating a nearby wireless emitter (e.g., one of wireless emitters/receivers 15).

The measurement devices may be components of the building equipment (e.g., integrated with the building equipment as shown in FIG. 4) or components of a mobile device separate from the building equipment (e.g., integrated with a mobile device as shown in FIG. 5). For embodiments in which the measurement devices are components of a mobile device, the mobile device may be physically located at the same physical location as the building equipment at the time the location information are measured. In some embodiments, the location information include GPS coordinates measured by the mobile device at an entrance of the building and distance differential data indicating a distance between the entrance of the building and the building equipment. The distance differential data may be obtained by an accelerometer or other measurement device capable of measuring a change in position between the building entrance and the location of the building equipment.

Still referring to FIG. 8, process 800 is shown to include automatically determining the physical location of the building equipment using the measured location information (step 804). In some embodiments, step 804 is performed by location determination module 152 as described with reference to FIG. 6A. In some embodiments, step 804 includes determining the location of a BMS device based on an emitter identifier or emitter identifiers received from the BMS device. For example, step 804 may include using the emitter identifier(s) received from a BMS device to determine which of the plurality of wireless emitters/receivers 15 is closest to the BMS device (e.g., based on signal strength, triangulation, etc.). Step 804 may include using an emitter identifier received from a BMS device as an input to a relational database (e.g., a lookup table, a device mapping, etc.). Each emitter identifier may uniquely indicate a particular wireless emitter (e.g., by emitter device name, by serial number, etc.) and/or a particular location (e.g., a zone name, a zone identifier, etc.) in the relational database.

In some embodiments, step 804 includes using GPS data and/or altitude data to determine a three-dimensional location of a BMS device. GPS data may provide a two-dimensional location (e.g., latitude and longitude) and the altitude data may provide a one-dimensional location (e.g., altitude). Step 804 may include combining the GPS data with the altitude data to determine a three-dimensional location. For embodiments in which the location information is received from a mobile device, the mobile device may record a GPS location and/or altitude at the location of the building equipment or at an entrance of the building (e.g., for embodiments in which the GPS signal is too weak to determine obtain a GPS measurement within building 10). For embodiments in which the GPS location is recorded at the building entrance, step 804 may include calculating the physical location of the building equipment using the GPS location of the building entrance and the distance differential data (e.g., accelerometer measurements) indicating a distance between the building entrance and the location of the building equipment. In some embodiments, step 804 includes associating a three-dimensional location with a device identifier and storing the association in a locations database.

Still referring to FIG. 8, process 800 is shown to include integrating the physical location of the building equipment with an architectural model of a building served by the building equipment (step 806). In some embodiments, step 806 includes generating or obtaining a three-dimensional architectural model of the building. The architectural building model may specify the physical structures and dimensions of the building (e.g., interior and exterior wall locations, window locations, stair/elevator locations, room dimensions, etc.).

In some embodiments, step 806 includes using existing blueprints or floor plans for the building to generate the architectural building model. For example, step 806 may include receiving a scanned or imported image of a blueprint or floor plan. Step 806 may include analyzing the blueprints or floor plans to generate a three-dimensional model of the building. In other embodiments, step 806 include importing the three-dimensional model from a CAD file (e.g., .dxf drawings) or drawing generated by architecture software or design software. In some embodiments, step 806 includes creating a new architectural building model (e.g., generating a new model based on user input).

In some embodiments, step 806 includes generating a new architectural building model based on optical imaging or other automated measurements of the building. For example, a mobile device can be used to measure wall locations and other physical structures (e.g., door locations, ceiling heights, stair locations, etc.) within the building using any of a variety of positioning or ranging techniques (e.g., optical sensing, radar, sonar, lidar, etc.). The location of the mobile device can be determined using any of the methods described above with reference to step 804.

The mobile device may report location information (e.g., GPS coordinates, accelerometer data, altitude data, etc.), orientation information (e.g., a direction that the mobile device is facing) and structure detection information at multiple different locations within the building. Step 806 may include generating a three-dimensional building model based on the location/orientation of the mobile device and the measured distances to various structures within the building at each of a plurality of measurement locations. Step 806 may include storing the architectural building model in a database.

Step 806 may include integrating (e.g., applying, combining, merging, etc.) the architectural building model with the BMS device location information determined in step 804. For example, the location information determined in step 804 may define the locations of BMS devices as points floating in three-dimensional space. Step 806 may include applying the locations of the BMS devices to the architectural building model to map each three-dimensional location to a particular location within the building.

In some embodiments, the BMS device location information defines the locations of the BMS devices according to a first coordinate system and the architectural model defines the architecture of the building according to a second coordinate system. Step 806 may include merging the first coordinate system with the second coordinate system to generate an integrated model that includes both a three-dimensional architectural representation of the building and the locations of various BMS devices.

In some embodiments, step 806 includes receiving calibration data. The calibration data may identify a point in the building architectural model (e.g., a three-dimensional location) that corresponds to a particular point relative to the locations of the BMS devices (i.e., a shared point between the first coordinate system and the second coordinate system). The calibration data may include multiple calibration points measured at various locations in or around the building (e.g., a location measured at a southwest corner of the building, a location measured at a northeast corner of the building, etc.). Step 806 may include using the calibration data to scale and/or orient the building architectural model relative to the floating points representing the three-dimensional locations of various BMS devices. Step 806 may include generating an integrated building model (e.g., a three-dimensional architectural model) that defines the architecture of the building and specifies the locations of BMS devices relative to the architecture of the building (e.g., within a wall, in a particular room or zone, on the roof, etc.).

Still referring to FIG. 8, process 800 is shown to include generating a graphical visualization of the building equipment integrated with the architectural model of the building (step 808). In some embodiments, step 808 is performed by model visualization module 158 as described with reference to FIG. 6A. Step 808 may include generating or providing a graphical user interface (GUI) for visualizing the integrated model generated in step 806. Step 808 may include generating a GUI that includes a three-dimensional architectural model of the building with the locations of various BMS devices represented visually in the three-dimensional architectural model. The location of each BMS device may be shown relative to the architecture of the building. An example of a graphical visualization that can be generated in step 808 is shown in FIG. 7.

In some embodiments, step 808 includes representing BMS devices using three-dimensional objects in the graphical visualization. For example, step 808 may include accessing the device identifiers stored in locations database 46 to identify a type of device located at each of the indicated locations in the integrated model. Step 808 may include retrieving three-dimensional representations of one or more device types (e.g., a CAD model of a chiller, a CAD model of an AHU, etc.) and inserting the three-dimensional representations at the specified locations in the integrated model. For example, step 808 may include representing a chiller in the graphical visualization using a three-dimensional model of a chiller positioned at the location in the building associated with the chiller.

In some embodiments, step 808 includes representing BMS devices in the graphical visualization according to equipment-specific attributes and/or status. For example, step 808 may include interacting with local applications 150 (e.g., a fault detection application) to identify fault indications for the BMS devices. In some embodiments, step 808 includes visually representing a detected fault by manipulating a visual attribute of the corresponding BMS device (e.g., highlighting BMS devices with detected faults, representing BMS devices with detected faults as flashing red, etc.).

In some embodiments, step 808 includes adjusting the visual appearance of BMS devices in the graphical visualization based on an operating status (e.g., active, inactive, etc.) or performance metric (e.g., energy consumption, efficiency, etc.). For example, BMS devices that are operating efficiently may be represented using a first color (e.g., green or blue) whereas BMS devices that are operating inefficiently may be represented using a second color (e.g., yellow, orange, or red).

In some embodiments, step 808 includes representing relationships between BMS devices in the graphical visualization. For example, related BMS devices (e.g., an AHU and a VAV box that receives airflow from the AHU) may be visually associated in the graphical visualization (e.g., connected by a line, represented using the same color, etc.). In some embodiments, step 808 includes adjusting the graphical visualization to allow a user to view relationships between BMS devices. For example, step 808 may include highlighting or emphasizing BMS devices that are related to a user-selected BMS device.

The visualization provided by in step 808 may facilitate locating a particular BMS device for service or maintenance. For example, service personnel can access the GUI provided in step 808 to identify a specific location of a faulty BMS device (e.g., above a particular ceiling tile, within a wall six feet from the corner of a room, etc.). The specific locations provided in step 808 define the locations of BMS devices more precisely and more accurately relative to traditional systems (e.g., systems which specify only a room location or general physical location). Advantageously, the specific locations provided in step 808 may allow BMS devices to be readily located without requiring service personnel to search in a general location.

Step 808 may include interacting with client services 146, application services 148, and/or local applications 150 to provide the visualization of the integrated model to local or remote clients (e.g., UI clients 16, remote applications 18, etc.). A user can access the graphical visualization locally or remotely to view the attributes, status, relationships, locations, and other information associated with various BMS devices.

Still referring to FIG. 8, process 800 is shown to include using the physical location of the building equipment to generate an association between the building equipment and other building equipment that serves the building (step 810). In some embodiments, step 810 is performed by equipment association module 160, as described with reference to FIG. 6A. Step 810 may include automatically associating BMS devices and/or recommending device associations based on the locations of the BMS devices. Step 810 may include generating associations between BMS devices (i.e., associating one BMS device with another BMS device) or between a BMS device and a building zone. For each BMS device, step 810 may include generating an association with one or more nearby BMS devices based on the device locations determined in step 804.

In some embodiments, step 810 includes populating a list of nearby BMS devices (e.g., sorted by Euclidian distance). Step 810 may include populating a relationship table with nearby devices that could potentially be related. For example, if the BMS device is a thermostat, the relationship table may include a potential relationship between the thermostat and a nearby VAV box. In some embodiments, step 810 includes suggesting a list of likely relationships between BMS devices (e.g., ranked based on distance and/or relevance) for a user to confirm or reject. In other embodiments, step 810 includes automatically associating BMS devices without requiring user intervention.

Advantageously, the location-based equipment associations formed or recommended in step 810 may facilitate automated device pairing for wireless devices. For example, step 810 may include automatically associating a wireless thermostat with a particular building zone or with another BMS device (e.g., a VAV box for the room in which the thermostat is located) based on the location of the wireless thermostat in the building. If the wireless thermostat is located in the same room or zone as a VAV box, step 810 may include automatically associating the wireless thermostat with the VAV box.

Still referring to FIG. 8, process 800 is shown to include using the physical location of the building equipment to generate an association between the building equipment and a building zone (step 812). Step 812 may include identifying a room or zone in which a BMS device is located using the integrated architectural model generated in step 806. In some embodiments, step 812 includes automatically generating a building object for the building zone (e.g., using building object templates 140). Step 812 may include associating a nearby BMS device with the building zone by adding an input or output of the BMS device as an attribute of the building zone.

In some embodiments, step 812 includes providing a GUI to a user (e.g., a service or installation technician) to facilitate forming associations between BMS devices and/or building zones. The GUI may display recommended device associations based on the location of the equipment. For example, the GUI may include the integrated three-dimensional model generated in step 806. Recommended device associations may be shown by lines (e.g., augmented reality lines) connecting BMS devices in the integrated model. The user can confirm or reject the recommended associations via the GUI.

Still referring to FIG. 8, process 800 is shown to include using the physical location of the building equipment to automatically address the building equipment (step 814). In some embodiments, step 814 is performed by equipment addressing module 162 as described with reference to FIG. 6A. Step 814 may include accessing locations database 46 to determine the locations of BMS devices in the building. Step 814 may include assigning unique parameters to building equipment (e.g., a MAC address, a device name, a device identifier, etc.) during commissioning and/or installation (e.g., a new installation or a retrofit installation). The unique parameters assigned to a BMS device in step 814 may be guaranteed to be different for various BMS devices.

Step 814 may include assigning a device name to a BMS device according to a naming convention based on the location of the BMS device and/or the room or building zone in which the BMS device is located. For example, step 814 may include naming a VAV box "VAV.B1_F3_CR5" if the VAV box is located in conference room 5 on floor 3 of building 1. Advantageously, automatically assigning device names to various BMS devices avoids requiring technicians to set unique addresses for all equipment using a manual dip switch.

Still referring to FIG. 8, process 800 is shown to include using the physical location of the building equipment to generate an a control parameter or a control algorithm for the building (step 816). In some embodiments, step 816 is performed by building control services module 164 as described with reference to FIG. 6A. Step 816 may include automatically setting or recommending control parameters for BMS devices based on the locations of the BMS devices.

For example, step 816 may include automatically setting a flow rate setpoint for a VAV box based on the size of the building zone in which the VAV box is located.

Step 816 may include determining which of a plurality of sensors to use in conjunction with a feedback control loop based on the locations of the sensors within the building. For example, step 816 may include using a signal from a temperature sensor located in a building zone as a feedback signal for controlling the temperature of the building zone in which the temperature sensor is located.

In some embodiments, step 816 includes automatically generating control algorithms for a controller or a building zone based on the location of the zone in the building. For example, step 816 may include predicting a change in demand resulting from sunlight entering through windows based on the orientation of the building and the locations of the building zones (e.g., east-facing, west-facing, perimeter zones, interior zones, etc.).

Step 816 may include using zone location information and interactions between adjacent building zones (rather than considering each zone as an isolated system) to more efficiently control the temperature and/or airflow within the building. For control loops that are conducted at a larger scale (i.e., floor level) step 816 may include using the location of each building zone and/or BMS device to coordinate control functionality between building zones. For example, step 816 may include considering heat exchange and/or air exchange between adjacent building zones as a factor in determining an output control signal for the building zones.

In some embodiments, step 816 includes optimizing the energy efficiency of the building using the locations of various BMS devices and the control parameters associated therewith. Optimal control setpoints can be achieved in step 816 by using building equipment with a relatively lower energy cost (e.g., by causing airflow between connected building zones) in order to reduce the loading on building equipment with a relatively higher energy cost (e.g., chillers and roof top units). For example, a control algorithm generated in step 816 may include moving warmer air from higher elevation zones to lower elevation zones by establishing pressure gradients between connected building zones.

In some embodiments, step 816 includes generating location-based energy savings recommendations for particular building zones. For example, step 816 may include determining a change in heating or cooling demand resulting from sunlight entering through windows of perimeter building zones based on the orientation of the building and the locations of the building zones. Step 816 may include recommending a control strategy for window control system 22 (e.g., opening and closing window shades at particular times) in order to reduce the amount of energy required to heat or cool the perimeter building zones.

Still referring to FIG. 8, process 800 is shown to include using the physical location of the building equipment to generate an augmented reality display of the building equipment (step 818). In some embodiments, step 818 is performed by augmented reality module 166 as described with reference to FIG. 6A. Step 818 may include generating an augmented reality view of the building equipment locations in the integrated model from the perspective of an observer (e.g., a mobile device) within the building.

Step 818 may include generating an augmented reality display of the building equipment superimposed or projected upon a live camera-derived image from a mobile device within the building. The augmented reality display may allow a user to see building equipment that is hidden behind walls or located in a ceiling or floor. For example, a user can point a mobile device with a camera (e.g., a smart phone, a tablet, etc.) toward a wall that has building equipment located on the other side.

Step 818 may include determining the location and orientation of the mobile device in order to generate a view of the building equipment from the perspective of the mobile device. The location of the mobile device can be determined using any of the methods described above with reference to step 804. The orientation of the mobile device can be determined using an accelerometer and/or compass integrated with the mobile device. For example, the mobile device may report location information (e.g., GPS coordinates, accelerometer data, altitude data, etc.) and orientation information (e.g., a direction that the mobile device is facing). Step 818 may include superimposing a view of the building equipment from the perspective of the mobile device upon the camera-derived image such that the building equipment is visible in the augmented reality display.

In some embodiments, step 818 includes representing BMS devices in the augmented reality display according to equipment-specific attributes and/or status. For example, step 818 may include interacting with local applications 150 (e.g., a fault detection application) to identify fault indications for the BMS devices. In some embodiments, step 818 includes visually representing a detected fault by manipulating a visual attribute of the corresponding BMS device (e.g., highlighting BMS devices with detected faults, representing BMS devices with detected faults as flashing red, etc.).

In some embodiments, step 818 includes adjusting the visual appearance of BMS devices in the augmented reality display based on an operating status (e.g., active, inactive, etc.) or performance metric (e.g., energy consumption, efficiency, etc.). For example, BMS devices that are operating efficiently may be represented using a first color (e.g., green or blue) whereas BMS devices that are operating inefficiently may be represented using a second color (e.g., yellow, orange, or red). In some embodiments, step 818 includes representing relationships between BMS devices in the augmented reality display. For example, related BMS devices (e.g., an AHU and a VAV box that receives airflow from the AHU) may be visually associated in the augmented reality display (e.g., connected by an augmented reality line, etc.).

Advantageously, the augmented reality display provided in step 818 may facilitate locating a particular BMS device for service or maintenance. For example, service personnel can use the augmented reality display to locate a faulty BMS device that is hidden from view (e.g., within a wall, above a ceiling tile, etc.). The augmented reality display may allow BMS devices to be readily located without requiring service personnel to search in a general location.

Figure 9:
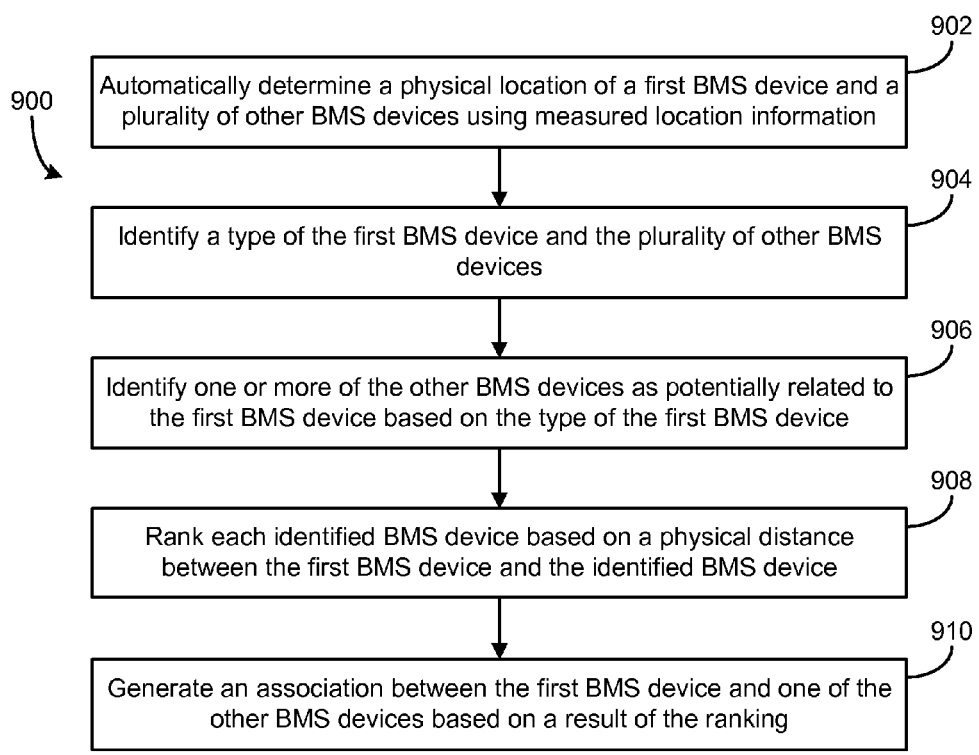
FIG. 9 is a flowchart of a process for automatically assigning relationships between building equipment based on the locations of the building equipment in the building of FIG. 1, according to an exemplary embodiment.

Referring now to FIG. 9, a flowchart of a process 900 for assigning relationships between BMS devices is shown, according to an exemplary embodiment. In some embodiments, process 900 is performed by BMS controller 12, as described with reference to FIGS. 2-6. Process 900 may be used to accomplish step 812 of process 800, described with reference to FIG. 8.

Process 900 is shown to include automatically determining a physical location of a first BMS device and a plurality of other BMS devices using measured location information (step 902). Step 902 may be the same or similar to step 804 of process 800. For example, step 902 may include determining the location of a BMS device based on an emitter identifier or emitter identifiers received from the BMS device. For example, step 902 may include using the emitter identifier(s) received from a BMS device to determine which of the plurality of wireless emitters/receivers 15 is closest to the BMS device (e.g., based on signal strength, triangulation, etc.). Step 902 may include using an emitter identifier received from a BMS device as an input to a relational database (e.g., a lookup table, a device mapping, etc.). Each emitter identifier may uniquely indicate a particular wireless emitter (e.g., by emitter device name, by serial number, etc.) and/or a particular location (e.g., a zone name, a zone identifier, etc.) in the relational database.

In some embodiments, step 902 includes using GPS data and/or altitude data to determine a three-dimensional location of a BMS device. GPS data may provide a two-dimensional location (e.g., latitude and longitude) and the altitude data may provide a one-dimensional location (e.g., altitude). Step 902 may include combining the GPS data with the altitude data to determine a three-dimensional location. For embodiments in which the location information is received from a mobile device, the mobile device may record a GPS location and/or altitude at the location of the building equipment or at an entrance of the building (e.g., for embodiments in which the GPS signal is too weak to determine obtain a GPS measurement within building 10). For embodiments in which the GPS location is recorded at the building entrance, step 902 may include calculating the physical location of the building equipment using the GPS location of the building entrance and the distance differential data (e.g., accelerometer measurements) indicating a distance between the building entrance and the location of the building equipment. In some embodiments, step 902 includes associating a three-dimensional location with a device identifier and storing the association in a locations database.

Still referring to FIG. 9, process 900 is shown to include identifying a type of the first BMS device and the plurality of other BMS devices (step 904). In some embodiments, the measured location information is provided to BMS controller 12 in conjunction with a device identifier. The device identifier may indicate a device name (e.g., "Chiller A," "AHU 1," etc.), a device category, a MAC address, a network location, or other information identifying a particular BMS device. Step 904 may include using the device identifier to determine a type of BMS device for each of the BMS devices. The type of a BMS device may describe the function of the device in the building management system. For example, devices "AHU 1" and "AHU 2" may have device types of "air handling unit" whereas device "Chiller A" may have a device type of "chiller."

Still referring to FIG. 9, process 900 is shown to include identifying one or more of the other BMS devices as potentially related to the first BMS device based on the type of the first BMS device (step 906). The device types may indicate whether two BMS devices are configured to perform the same function (e.g., for different building zones) or different functions (e.g., for the same building zone). For example, a chiller may be configured to cool air for a particular building zone and an AHU may be configured to provide airflow for the building zone. If two BMS devices have complementary functions, step 906 may include identifying the BMS devices as potentially related because both devices may be configured to serve the same building zone. In some embodiments, step 906 includes identifying two BMS devices as potentially related if the output from one of the BMS devices has the potential to affect the other BMS device. For example, if the temperature measured by a temperature sensor affects (e.g., via a feedback control loop) an airflow provided by a VAV box, the temperature sensor and the VAV box are causally related.

The causal relationships identified in step 906 may be based substantially on the device types. In some embodiments, step 906 includes accessing a database to retrieve a listing of device types that are potentially related to the first BMS device. Step 906 may include identifying the first BMS device and a second BMS device as potentially related if the device type of the second BMS device is one of the potentially related device types for the first BMS device (or vice-versa), as indicated by the listings of potentially related device types.

Still referring to FIG. 9, process 900 is shown to include ranking each identified BMS device based on a physical distance between the first BMS device and the identified BMS device (step 908). In some embodiments, the physical distance is a function of the physical location of the first BMS device and the physical location of the identified BMS device. BMS devices that are relatively closer to the first BMS device may receive a relatively lower ranking whereas BMS devices that are relatively further from the first BMS device may receive a relatively higher ranking. In other words, the rankings assigned in step 908 may follow the same order as a listing of the identified BMS devices arranged in ascending order from closest to furthest from the first BMS device (e.g., the closest identified device ranked #1, the second closest identified device ranked #2, etc.).

The rankings assigned in step 908 may indicate a relative likelihood for two BMS devices to be related. For example, a VAV box located within ten feet of a temperature sensor is more likely to control airflow to the building zone in which the temperature sensor is located than a VAV box located five hundred feet from the temperature sensor. In some embodiments, the rankings assigned in step 908 are a function of other factors in addition to the distance between BMS devices. For example, the rankings may be based on whether the BMS devices are on the same floor, whether one of the BMS devices is already associated with a device of the same type as the other BMS device, a weight associated with each potentially related device type, and/or other factors that indicate a likelihood of two BMS devices to be related.

Still referring to FIG. 9, process 900 is shown to include generating an association between the first BMS device and one of the other BMS devices based on a result of the ranking (step 910). In some embodiments, the association between the first BMS device and the other BMS device generated in step 910 is a recommended association. The recommended association may be presented to a user via a user interface device. The user may be prompted to confirm or reject the recommended association. In some embodiments, step 910 includes automatically associating BMS devices without requiring user intervention.

Embodiments of the subject matter and the operations described in this specification can be implemented in digital electronic circuitry, or in computer software embodied on a tangible medium, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on one or more computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, or other storage devices). Accordingly, the computer storage medium may be tangible and non-transitory.

The operations described in this specification can be implemented as operations performed by a data processing apparatus on data stored on one or more computer-readable storage devices or received from other sources.

The term "client or "server" include all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube), LCD (liquid crystal display), OLED (organic light emitting diode), TFT (thin-film transistor), plasma, other flexible configuration, or any other monitor for displaying information to the user and a keyboard, a pointing device, e.g., a mouse, trackball, etc., or a touch screen, touch pad, etc., by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an embodiment of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific embodiment details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product embodied on a tangible medium or packaged into multiple such software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain embodiments, multitasking and parallel processing may be advantageous.

The background section is intended to provide a background or context to the invention recited in the claims. The description in the background section may include concepts that could be pursued, but are not necessarily ones that have been previously conceived or pursued. Therefore, unless otherwise indicated herein, what is described in the background section is not prior art to the description or claims and is not admitted to be prior art by inclusion in the background section.

What is claimed is:

1. A method for detecting and using equipment location in a building management system for a building, the method comprising:
   receiving measured location information at a processing circuit, wherein the measured location information is obtained by one or more measurement devices at one or more physical locations of building equipment in a building management system, the building equipment comprising a first BMS device and one or more other BMS devices;
   automatically determining, by the processing circuit, the physical locations of the building equipment in the building management system using the measured location information;
   ranking each of the other BMS devices based on a physical distance between the first BMS device and the other BMS devices, wherein each physical distance is a function of the physical location of the first BMS device and one of the physical locations of the other BMS devices;
   generating an association between the first BMS device and one of the other BMS devices based on a result of the ranking; and
   controlling a building zone by operating the one of the other BMS devices to affect an environmental condition of the building zone.

2. The method of claim 1, further comprising:
   predicting at least one of a heat exchange and an air exchange between first and second zones of the building based on a spatial relationship between the first and second zones;
   using the predicted heat exchange or air exchange to generate an expanded control loop and a control algorithm for the expanded control loop; and
   controlling the first and second zones of the building using the expanded control loop.

3. The method of claim 2, wherein generating a control algorithm for the expanded control loop comprises:
   determining whether building equipment associated with the first zone can be used to reduce an amount of energy consumption required to achieve target conditions within the second zone; and
   generating at least one of a control algorithm and a control parameter that uses the building equipment associated with the first zone to achieve target conditions within the second zone in response to determination that the building equipment associated with the first zone can be used to reduce the amount of energy consumption required to achieve target conditions within the second zone.

4. The method of claim 2, wherein controlling the first and second zones of the building using the expanded control loop comprises causing an airflow between the first and second zones by establishing a pressure gradient between the first and second zones.

5. The method of claim 1, further comprising:
   receiving a device identifier in conjunction with the measured location information, the device identifier indicating a particular building equipment device; and
   storing an association between the device identifier and a physical location of the particular building equipment device.

6. The method of claim 1, further comprising:
   generating, by the processing circuit, a graphical visualization of the building equipment integrated with an architectural model of the building, wherein the building equipment is displayed in the graphical visualization at the locations determined by the processing circuit.

7. The method of claim 6, wherein the graphical visualization of the building equipment comprises at least one of equipment-specific attributes for the building equipment and a current status of the building equipment.

8. The method of claim 1, wherein the physical locations of the building equipment are three-dimensional physical locations.

9. The method of claim 1, wherein the one or more measurement devices comprise at least one of a GPS device and an altimeter; and
   wherein the measured location information comprise at least one of GPS coordinates and an altitude measurement.

10. The method of claim 1, wherein the one or more measurement devices are components of the building equipment.

11. The method of claim 1, wherein the one or more measurement devices are components of a mobile device separate from the building equipment.

12. The method of claim 11, wherein the measured location information comprise GPS coordinates measured by the mobile device at an entrance of the building and distance differential data indicating a distance between the entrance of the building and the building equipment;

wherein automatically determining the physical locations of the building equipment comprises calculating the physical locations of the building equipment using the GPS coordinates and the distance differential data.

13. The method of claim 1, further comprising:
using the physical locations of the building equipment to generate an association between the building equipment and other building equipment of the building management system.

14. The method of claim 1, further comprising:
using the physical locations of the building equipment to automatically address the building equipment.

15. The method of claim 1, further comprising:
generating an augmented reality display of the building equipment, the augmented reality display comprising a view of a graphical visualization of the building equipment from a perspective of a mobile device superimposed over a camera-derived view of the building from the perspective of the mobile device.

16. A method for assigning relationships between building management system (BMS) devices, the method comprising:
automatically determining, by a processing circuit, a physical location of a first BMS device and a physical location of a plurality of other BMS devices using location information measured at the physical locations;
identifying a type of the first BMS device and the plurality of other BMS devices;
identifying one or more of the other BMS devices as potentially related to the first BMS device based on the type of the first BMS device, wherein the first BMS device is a sensor configured to measure an environmental condition within a building zone and one or more of the identified BMS devices are configured to affect the environmental condition measured by the first BMS device;
ranking each identified BMS device based on a physical distance between the first BMS device and the identified BMS device, wherein the physical distance is a function of the physical location of the first BMS device and the physical location of the identified BMS device;
generating an association between the first BMS device and one of the other BMS devices based on a result of the ranking; and
controlling the building zone by operating the one of the other BMS devices to affect the environmental condition measured by the first BMS device.

17. The method of claim 16, wherein the association between the first BMS device and one of the other BMS devices is a recommended association, the method further comprising:
presenting the recommended association via a user interface device; and
prompting a user to confirm or reject the recommended association.

18. A system for detecting and using equipment location in a building management system, the system comprising:
a processing circuit configured to receive measured location information, wherein the measured location information is obtained by one or more measurement devices at a physical location of building equipment in a building management system, wherein the one or more measurement devices are components of the building equipment;
wherein the processing circuit is configured to automatically determine the physical location of the building equipment in the building management system using the measured location information;
wherein the processing circuit is configured to integrate the physical location of the building equipment with an architectural model of a building serviced by the building management system;
wherein the processing circuit is configured to generate a graphical visualization of the building equipment integrated with the architectural model of the building, wherein the building equipment is displayed in the graphical visualization at the physical location determined by the processing circuit; and
wherein the processing circuit is configured to generate an augmented reality display of the building equipment, the augmented reality display comprising a view of the graphical visualization of the building equipment from a perspective of a mobile device superimposed over a camera-derived view of the building from the perspective of the mobile device.

19. The system of claim 18, wherein the augmented reality display of the building equipment comprises at least one of equipment-specific attributes for the building equipment and a current status of the building equipment.

20. The system of claim 18, wherein the one or more measurement devices comprise at least one of a GPS device and an altimeter; and
wherein the one or more measurement devices are components of the building equipment or components of a mobile device separate from the building equipment.

* * * * *